(12) United States Patent
Gerginov

(10) Patent No.: US 11,143,721 B2
(45) Date of Patent: Oct. 12, 2021

(54) NOISE REDUCTION IN RF ATOMIC MAGNETOMETER

(71) Applicant: The Regents of the University of Colorado, a body corporate, Denver, CO (US)

(72) Inventor: Vladislav Gerginov, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 214 days.

(21) Appl. No.: 16/572,423

(22) Filed: Sep. 16, 2019

(65) Prior Publication Data

US 2020/0088814 A1    Mar. 19, 2020

Related U.S. Application Data

(60) Provisional application No. 62/731,662, filed on Sep. 14, 2018.

(51) Int. Cl.
*G01R 33/26* (2006.01)

(52) U.S. Cl.
CPC ................ *G01R 33/26* (2013.01)

(58) Field of Classification Search
CPC ........................................... G01R 33/26
See application file for complete search history.

(56) References Cited

U.S. PATENT DOCUMENTS

| 7,038,450 | B2 | 5/2006 | Romalis et al. |
|---|---|---|---|
| 7,521,928 | B2 | 4/2009 | Romalis et al. |
| 8,212,556 | B1 | 7/2012 | Schwindt et al. |
| 8,373,413 | B2 | 2/2013 | Sugioka |
| 9,614,589 | B1 | 4/2017 | Russo et al. |
| 9,726,733 | B2 | 8/2017 | Smith et al. |
| 2010/0090697 | A1 | 4/2010 | Savukov et al. |
| 2010/0219827 | A1 | 9/2010 | Matlashov et al. |
| 2010/0289491 | A1 | 11/2010 | Budker et al. |
| 2017/0207823 | A1 | 7/2017 | Busso et al. |
| 2020/0103475 | A1* | 4/2020 | Kim ................ G01R 33/26 |

OTHER PUBLICATIONS

Aleksandrov, E. B. et al., "Modern Radio-Optical Methods in Quantum Magnetometry," Physics-Uspekhi, vol. 52, No. 6, pp. 573-601, 2009.

(Continued)

*Primary Examiner* — Susan S Lee

(57) ABSTRACT

A probe beam is passed through a first optically pumped magnetometer vapor cell portion that has a first magnetic bias field orientation relative to a pump beam. The probe beam is also passed through a second optically pumped magnetometer vapor cell portion that has a second magnetic bias field orientation relative to the pump beam with the same properties as in the first portion, where the first magnetic bias field orientation is opposite to that of the second magnetic bias field orientation. This configuration reduces or eliminates linearly polarized magnetic signals (e.g., noise) from the output probe beam and passes circularly polarized magnetic signals. Thus, the intensity of the probe beam after passing through the first and second optically pumped magnetometer vapor cell portions is measured to obtain a noise suppressed signal.

20 Claims, 13 Drawing Sheets

(56) References Cited

OTHER PUBLICATIONS

Arimondo, E. et al., "Experimental Determinations of the Hyperfine Structure in the Alkali Atoms," Reviews of Modern Physics, vol. 49, No. 1, pp. 31-75, Jan. 1977.
Bloom, Arnold L., "Principles of Operation of the Rubidium Vapor Magnetometer," Applied Optics, vol. 1, No. 1, pp. 61-68, Jan. 1962.
Breit, G. et al., "Measurement of Nuclear Spin," Letters to the Editor, pp. 2082, 2083, Nov. 10, 1931.
Budker, Dmitry et al., "Optical Magnetometry," Nature Physics, vol. 3, pp. 227-234, Apr. 2007.
Clarke, John, "Squids: Then and Now," International Journal of Modern Physics B, vol. 24, Nos. 20 and 21, pp. 3999-4038, 2010.
Constable, Catherine, "Earth's Electromagnetic Environment," Surveys in Geophysics, vol. 37, pp. 27-45, 2016.
Cooper, Robert J. et al., "RF Atomic Magnetometer Array With Over 40 dB Interference Suppression Using Electron Spin Resonance," Journal of Magnetic Resonance, vol. 296, pp. 36-46, 2018.
Da Silva, F. C. S. et al., "A Z-Component Magnetoresistive Sensor," Applied Physics Letters, vol. 92, pp. 142502-1-142502-3, 2008.
Davis, John R. et al., "Development of a Superconducting ELF Receiving Antenna," IEEE Transactions on Antennas and Propagation, vol. AP-25, No. 2, pp. 223-231, Mar. 1977.
Gerginov, V., "Field-Polarization Sensitivity in RF Atomic Magnetometers," Physical Review Applied, vol. 11, pp. 024008-1-024008-10, Feb. 4, 2019.
Gerginov, V. et al., "Prospects for Magnetic Field Communications and Location Using Quantum Sensors," Review of Scientific Instruments, vol. 88, pp. 125005-1-125005-10, 2017.
Glybovski, Stanislav B. et al., "Metasurfaces: From Microwaves to Visible," Physics Reports, Vo. 634, pp. 1-72, 2016.
Happer, W. et al., "Effective Operator Formalism in Optical Pumping," Physical Review, vol. 163, No. 1, pp. 12-25, Nov. 5, 1967.
Kumar, Ananda et al., "Optimized Quadrature Surface Coil Designs," Magnetic Resonance Materials in Physics, Biology and Medicine, vol. 21, pp. 41-52, 2008.
Lee, S. K. et al., "Subfemtotesla Radio-Frequency Atomic Magnetometer for Detection of Nuclear Quadrupole Resonance," Applied Physics Letters, vol. 89, pp. 214106-1-214106-3, 2006.
NIST Logbook, "RF Magnetometer," pp. 128-129, Mar. 7, 2018.
Oida, Takenori et al., "Detecting Rotating Magnetic Fields Using Optically Pumped Atomic Magnetometers for Measuring Ultra-Low-Field Magnetic Resonance Signals," Journal of Magnetic Resonance, vol. 217, pp. 6-9, 2012.
Savukov, I. M. et al., "Detection of NMR Signals With a Radio-Frequency Atomic Magnetometer," Journal of Magnetic Resonance, vol. 185, pp. 214-220, 2007.
Savukov, I. M. et al., "NMR Detection With an Atomic Magnetometer," Physical Review Letters, vol. PRL 94, pp. 123001-1-123001-4, Apr. 1, 2005.
Savukov, I. M. et al., "Tunable Atomic Magnetometer for Detection of Radio-Frequency Magnetic Fields," vol. PRL 95, 063004-1-063004-4, Aug. 5, 2005.
Seltzer, S. J. et al., "Unshielded Three-Axis Vector Operation of a Spin-Exchange-Relaxation-Free Atomic Magnetometer," Applied Physics Letters, vol. 85, No. 20, pp. 4804-4806, Nov. 15, 2004.
Sheng, D. et al., "Subfemtotesla Scalar Atomic Magnetometry Using Multipass Cells," Physical Review Letters, vol. PRL 110, pp. 160802-1-160802-5, Apr. 19, 2013.
Slack, Howard A. et al., "The Geomagnetic Gradiometer," Geophysics, vol. XXXII, No. 5, pp. 877-892, Oct. 1967.
Slocum, Robert E. et al., "Low Field Helium Magnetometer for Space Applications," IEEE Transactions on Nuclear Science, pp. 165-171, Jan. 1963.
Zhivun, Elena et al., "Alkali-Vapor Magnetic Resonance Driven by Fictitious Radiofrequency Fields," Applied Physics Letters, vol. 105, pp. 192406-1-192406-4, 2014.
Ziolkowski, Richard W. et al., "Experimental Verification of Z Antennas At UHF Frequencies," IEEE Antennas and Wireless Propagation Letters, vol. 8, pp. 1329-1333, 2009.

\* cited by examiner

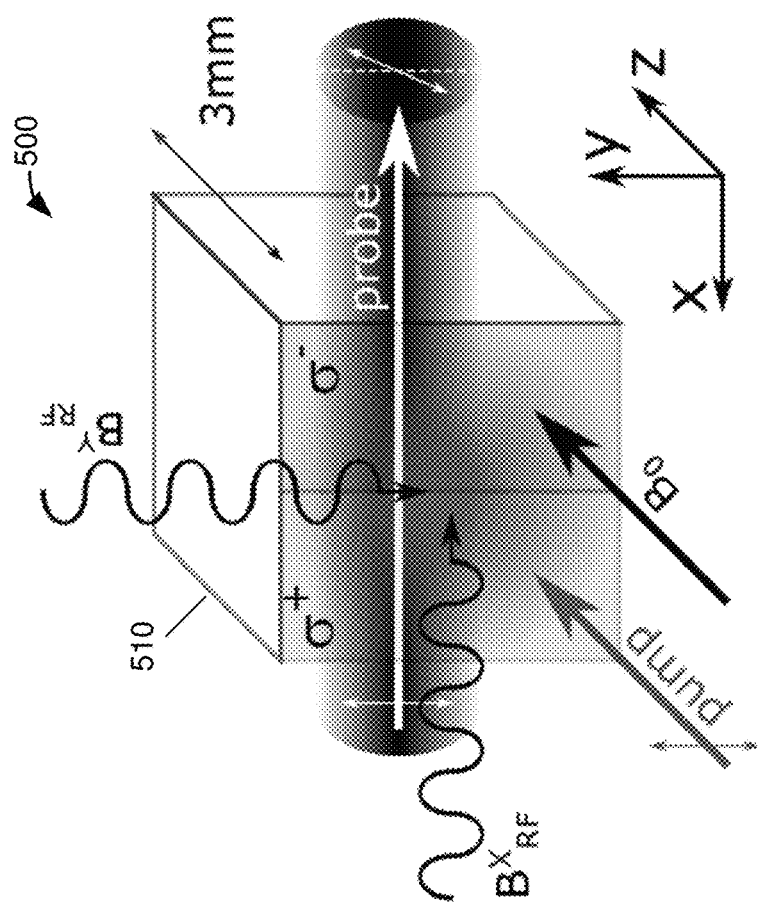
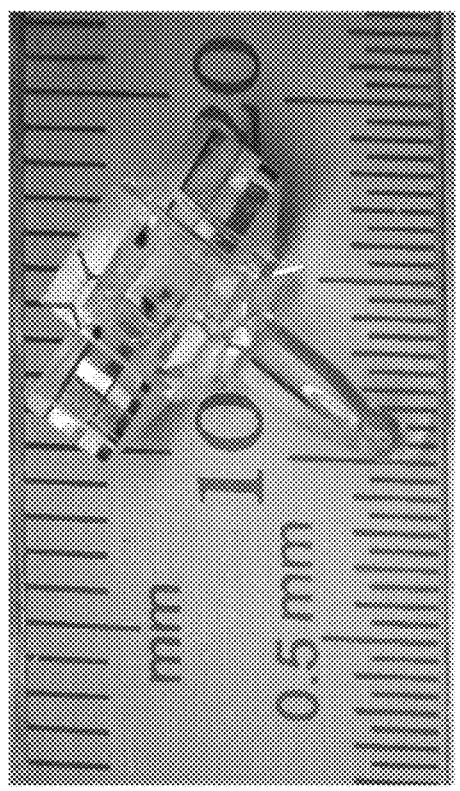
FIG. 5A
FIG. 5B

NOISE REDUCTION IN RF ATOMIC MAGNETOMETER

CROSS-REFERENCE TO RELATED APPLICATIONS

This application claims priority to U.S. Provisional Application Ser. No. 62/731,662 filed Sep. 14, 2019, which is incorporated herein by reference in its entirety for all purposes.

STATEMENT REGARDING FEDERALLY SPONSORED RESEARCH

This invention was made with government support under grant number 70NANB14H095 awarded by NIST. The government has certain rights in the invention.

TECHNICAL FIELD

Various embodiments of the present technology generally relate to radio frequency (RF) optically-pumped atomic magnetometers that use light to prepare (through optical pumping) the internal state of atoms such as alkali atoms (potassium, rubidium, cesium) or noble gases (helium) and measure the effect a magnetic field has on the atomic structure and the internal state of these atoms. More specifically, some embodiments relate to suppressing ambient noise received by an RF optically-pumped atomic magnetometer to better receive a circularly polarized magnetic signal.

BACKGROUND

Communications and location technologies are based primarily on the generation, transmission and reception of electromagnetic signals. In certain cases, the environment can distort, attenuate or even completely prevent the signals from propagating between transmitter and receiver (RF-, GPS-denied environments). Specifically, AC electromagnetic fields have a high attenuation in metals, solid materials (concrete, rock, soil, etc.) and water. The electromagnetic field propagating through a given material is attenuated exponentially (exponential attenuation law). The exponential attenuation with distance is three orders of magnitude smaller at 1 GHz than at 1 kHz signal in the same material. Another drawback is the long wavelength of the signal, and the large characteristic size of the antennae used for the most efficient RF link between transmitters and receivers.

It has been shown that detecting the magnetic component of the electromagnetic field is beneficial at low frequencies. The advantage of using low-frequency magnetic signals in the presence of strong medium absorption comes at the price of reduced bandwidth (BW), leading to limited communication channel capacity and location accuracy. Low-frequency magnetic fields have a dipole nature, and the signal strength drops with the third power of the distance (cubic attenuation law), thus reducing the signal range. Nevertheless, the advantages of using low-frequency magnetic signals for communication are: increased communication range using low-frequency magnetic signals in the presence of strong medium absorption, improved immunity to interference, as the source of interference will have to be within the communication range, and magnetic signals are immune to multi-path interference which is a result of signal reflection.

There is an acute need for development of small footprint, high-sensitivity, room temperature sensor of low-frequency magnetic signals which can operate in unshielded environment. The low-frequency magnetic signals can penetrate through conductive materials much further than RF signals, and their detection is of interest in global communications, atmosphere studies, through-the-earth radios, near-field communications and RFID tagging. Present coil-based high-sensitivity sensors of low frequency magnetic signals are bulky, as their sensitivity is inversely proportional to the signal frequency and the coil area:

$$|B_n| = \frac{\sqrt{4kTR_a}}{N_a A_a 2\pi f}$$

where k is the is the Boltzmann's constant, T is the temperature in Kelvin, $R_a$, $A_a$, and $N_a$ are the resistance, area and number of turns of the coil antenna, and f is the frequency. The coil-based systems achieve high sensitivity at the expense of size, typically on the order of 1 meter. The Superconducting Quantum Interference Device (SQUIDs) systems are cryogenic, complex and expensive. All present magnetic signal sensors require some form of ambient magnetic noise suppression techniques (exception are systems studying the ambient magnetic field background itself).

SUMMARY

Systems and methods are described for systems and methods for suppressing ambient noise received by an RF optically-pumped atomic magnetometer to better receive a circularly polarized magnetic signal. In some embodiments, a multichannel receiver can include a first channel, a second channel, and a conversion system. The first channel can be configured to pass a probe beam through a first optically pumped magnetometer vapor cell portion that has a first magnetic bias field orientation relative to a first circularly polarized pump beam. The second channel can be configured to pass the probe beam through a second optically pumped magnetometer vapor cell portion that has a second magnetic bias field orientation relative to a second circularly polarized pump beam. The first circularly polarized pump beam and the second circularly polarized pump beam can be identical (or nearly identical) in intensity, frequency, polarization, and direction of propagation. The first magnetic bias field orientation can be different from the second magnetic bias field orientation but have an equal magnitude. The first channel and the second channel can share a single probe beam in some embodiments and the first circularly polarized pump beam and the second circularly polarized pump beam may be the same circularly polarized pump beam.

The conversion system can be configured to convert optical properties of the probe beam affected by an incoming magnetic signal to electric signal, which adds outputs of the first channel and the second channel to suppress noise in the incoming magnetic signal. In some embodiments, the conversion system can optically sum an output of the first channel before a light to electric signal conversion takes place. The first optically pumped magnetometer vapor cell portion and the second optically pumped magnetometer vapor cell portion may be portions of the same optically pumped magnetometer vapor cell or portions of different optically pumped magnetometer vapor cells. In some embodiments, the first optically pumped magnetometer vapor cell portion and the second optically pumped magnetometer vapor cell portion may be inline and a circularly polarized signal cam pass through the first optically pumped magnetometer vapor cell portion and then the second optically pumped magnetometer vapor cell portion.

The first magnetic bias field, the second magnetic bias field, the first circularly polarized pump beam, and the second circularly polarized pump beam may all be parallel in some embodiments. The first channel and the second channel can share an absorber container in some embodiments and/or may each have different probe beams. The incoming magnetic signal can include a circularly polarized component and the second channel is insensitive to the incoming magnetic signal and measures linearly polarized noise within the incoming magnetic signal.

In some embodiments, a probe beam can be passed through a first optically pumped magnetometer vapor cell portion that has a first magnetic bias field orientation relative to a first circularly polarized pump beam. In addition, the probe beam can be passed through a second optically pumped magnetometer vapor cell portion that has a second magnetic bias field orientation relative to a second pump beam. The first circularly polarized pump beam and the second pump beam are identical in intensity, frequency, polarization, and direction of propagation. In some embodiments, the first magnetic bias field orientation can be opposite (or nearly opposite) to that of the second magnetic bias field orientation. Both the first magnetic bias field and the second magnetic bias field have an equal magnitude in some embodiments. A property of the probe beam can be measured after passing through the first optically pumped magnetometer vapor cell portion and the second optically pumped magnetometer vapor cell portion. The first vapor cell portion and the second vapor cell portion can include rubidium gas.

In some embodiments, a receiver can include a first optically pumped magnetometer vapor cell that has a first magnetic bias field orientation relative to a pump beam. The first optically pumped magnetometer vapor cell can include a path for a signal (e.g., circularly polarized and includes noise). The first optically pumped magnetometer vapor cell can be configured to create a first output signal that is equal to a signal plus any noise. The receiver may also include a second optically pumped magnetometer vapor cell that has a second magnetic bias field orientation relative to the pump beam. The first optically pumped magnetometer vapor cell and the second optically pumped magnetometer vapor cell can share the pump beam in some embodiments. The first magnetic bias field orientation can be different from the second magnetic bias field orientation. The second optically pumped magnetometer vapor cell can be configured to create a second output signal that is equal to a negative of the noise. The receiver may also include a conversion system to convert optical properties of a probe beam affected by an incoming magnetic signal to electric signal, which adds the first output signal and the second output signal, creating a third output signal corresponding to the incoming magnetic signal. The conversion system optically can be configured to sum the first output signal and the second output signal before a light to electric signal conversion takes place. In some embodiments, the first optically pumped magnetometer vapor cell and the second optically pumped magnetometer vapor cell can share a probe beam.

While multiple embodiments are disclosed, still other embodiments of the present invention will become apparent to those skilled in the art from the following detailed description, which shows and describes illustrative embodiments of the invention. As will be realized, the invention is capable of modifications in various aspects, all without departing from the scope of the present invention. Accordingly, the drawings and detailed description are to be regarded as illustrative in nature and not restrictive.

BRIEF DESCRIPTION OF THE DRAWINGS

Embodiments of the present technology will be described and explained through the use of the accompanying drawings.

FIG. 5A is an illustration of a two-channel optically-pumped RF magnetometer that may be used in some embodiments of the present technology.

FIG. 5B a photograph of an optical cell assembly that may be used in some embodiments of the present technology.

Figure 1:
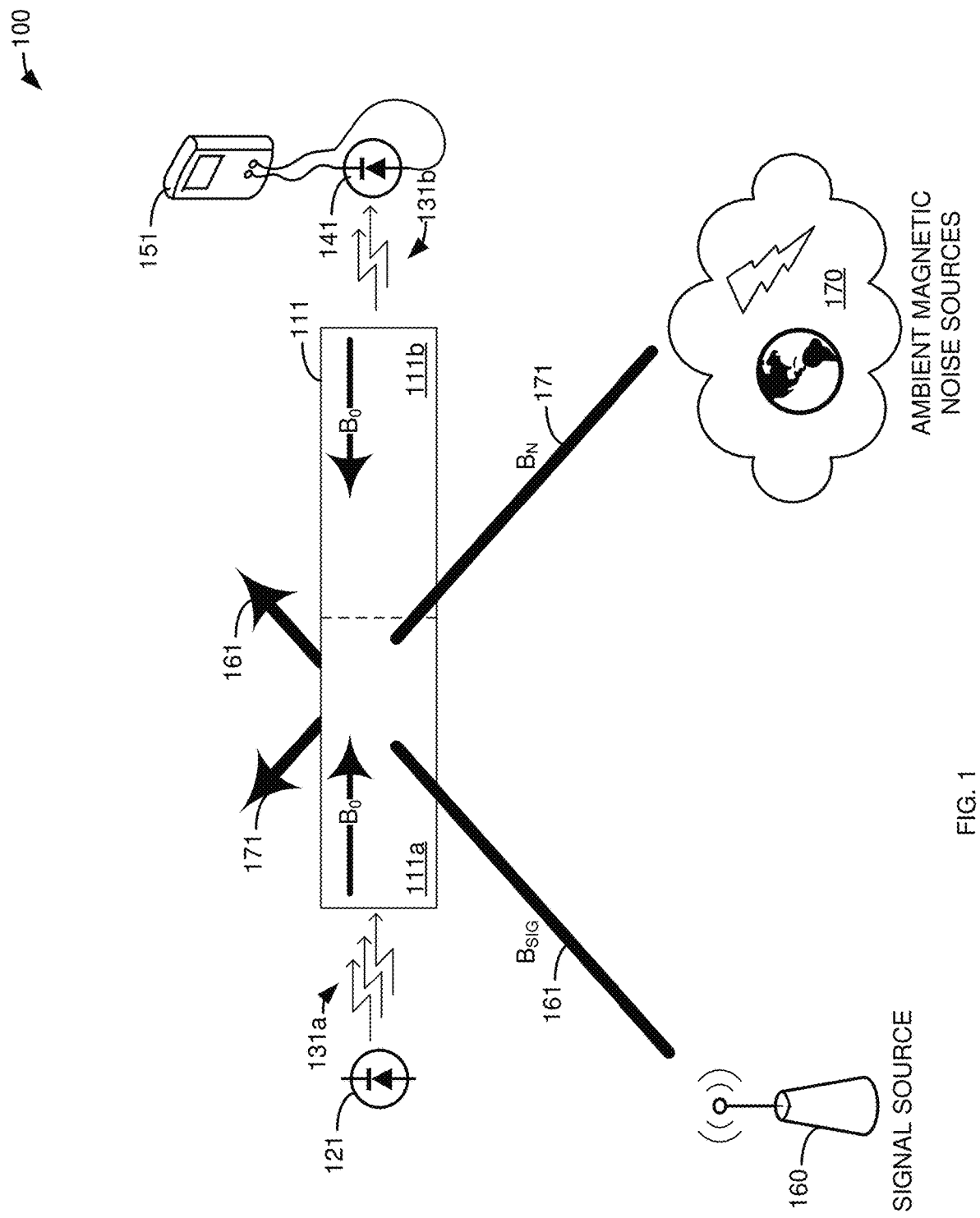
FIG. 1 is an illustration of an ambient noise suppressing optically pumped magnetometer that may be used in some embodiments of the present technology.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology generally relate to radio frequency (RF) optically pumped atomic magnetometers. More specifically, some embodiments relate to suppressing ambient noise received by an RF optically-pumped atomic magnetometer to better receive a circularly polarized magnetic signal. Optically pumped atomic magnetometers (OPMs) have impressive sensitivities reaching to subfemtotesla levels when measuring DC or RF magnetic fields. Thus, OPMs successfully compete with the state-of-the-art magnetic detectors based on Superconducting Quantum Interference Devices (SQUIDs). OPMs may be used in heavily shielded environments (e.g., in multilayer magnetically shielded rooms) or rely on active coils for ambient noise suppression. In an unshielded environment, the performance of the OPMs operating in the DC regime is degraded by several orders of magnitude due to the ambient magnetic field noise. Such situation can be remedied to some extent by averaging or the use of gradiometry techniques. The situation is better for the case of RF atomic magnetometers because the ambient noise caused either by geomagnetic, atmospheric or urban activities, is lower at higher frequencies. Nevertheless, noise suppression techniques are still required.

Reaching the ultimate intrinsic sensitivity of the state-of-the-art magnetic field sensors is achieved using two or more OPMs or OPM channels. The noise suppression techniques rely on the different distance to the signal and noise sources compared to the gradiometer baseline (the distance between the sensors). Early examples of distant source detection include magnetic anomaly detection and exploration of the Earth's magnetic field, as well as magnetic fields in space, while detection of local signal sources includes measurements of faint bio-magnetic signals.

Various embodiments of the present technology can use a two-channel optically-pumped atomic RF magnetometer capable of detecting low-frequency (below 1 MHz) magnetic field signals. The quantum properties of the RF magnetometer can be used to construct balanced detection schemes for measurement or suppression of ambient noise. Some embodiments do not rely on gradiometer methods and are expected to be largely immune to the relative distance between the signal and noise sources. Various embodiments rely on the quantum-mechanical laws of angular momentum conservation. The sensitivity of an RF atomic magnetometer can be exploited to the polarization state of an magnetic signal in a novel way that is demonstrated theoretically and experimentally in this work, achieving 33 dB rejection of the unwanted circular polarization of the RF field. A quantum receiver that includes ambient noise suppression is proposed. Future applications of the receiver include of communication or artificial low-frequency magnetic signals in the presence of strong absorption and ambient (geomagnetic, atmospheric, urban) magnetic field noise.

In some embodiments, a probe beam is passed through a first optically pumped magnetometer vapor cell (or cell portion) that has a first magnetic bias field orientation parallel to the direction of propagation of a first pump beam with a given circular polarization. It should be understood that using the same cell helps reduce common-mode sources of noise. The same (or a second) probe beam is passed through a second optically pumped magnetometer vapor cell (or cell portion) that has a second magnetic bias field of the same magnitude and direction parallel to the first magnetic bias field where the first magnetic bias field orientation is opposite to that of the second magnetic bias field orientation, and a second pump beam parallel to the second bias field, with the circular polarization and direction of propagation of the second pump beam identical to the circular polarization and direction of propagation of the first pump beam. The probe beam (or the sum of both probe beams) is detected. This configuration reduces or eliminates the effect of linearly polarized magnetic signals (e.g., noise) on the output probe beam(s) properties such as direction of light polarization, and keeps the effect of circularly polarized magnetic signals. Thus, the property such as polarization direction of the probe beam(s) after passing through the first and second optically pumped magnetometer vapor cells (or cell portions) is measured to obtain a noise suppressed signal.

It should be understood that the use of the same probe beam is easier but is not the only way. A person of ordinary skill should realize that it is difficult to create opposite-direction bias fields in the same cell, because there will be field gradients and a zero-field part of the cell. Thus, some embodiments may use two independent probe beams (from the same source) and combine them after the cell.

Various embodiments of the present technology provide both theoretically and experimentally based design of an optically pumped RF atomic magnetometer that has a minimum or a maximum sensitivity depending on the direction of a circularly-polarized RF signal. The sensitivity can be tuned by reversing the direction of the magnetometer's bias field. These results allow to realize balanced detection schemes that measure circularly-polarized RF signals and suppress linearly-polarized noise or measure the linearly-polarized noise and suppress circularly-polarized signals. These noise suppression schemes do not depend on the relative distance between the signal source, the noise source, and the sensor, and can be realized electronically or optically.

In the following description, for the purposes of explanation, numerous specific details are set forth in order to provide a thorough understanding of embodiments of the present technology. It will be apparent, however, to one skilled in the art that embodiments of the present technology may be practiced without some of these specific details.

The techniques introduced here can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions that may be used to program a computer (or other electronic devices) to perform a process. The machine-readable medium may include, but it not limited to, floppy diskettes, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

FIG. 1 is an illustration of an ambient noise suppressing optically-pumped magnetometer 100 that may be used in some embodiments of the present technology. In FIG. 1, noise suppressing optically-pumped magnetometer 100 comprises vapor cell 111, probe beam source 121, probe beam 131a-131b, probe beam parameter (such as direction of light polarization), sensor 141, and probe beam sensor measurement device 151. Note that the probe beam is perpendicular to the bias field $B_0$. However, in the two-dimensional drawings the bias fields and probe beams may be depicted as parallel for the sake of simplicity.

Vapor cell 111 includes at least two portions 111a and 111b. In portion 111a, a first bias magnetic field is applied in a first direction parallel to a first circularly-polarized pump beam (not shown in FIG. 1.). In portion 111b, a second bias magnetic field of the same magnitude as the first bias magnetic field and opposite direction to the first bias magnetic field is applied, together with a second pump beam (not shown in FIG. 1.) with identical circular polarization and direction as the first pump beam in portion 111a. Magnetic signal source 160 can emit circularly-polarized magnetic field signal 161 which passes through both portions 111a and 111b. Likewise, ambient magnetic noise source(s) 170 emit linearly-polarized magnetic field(s) that also pass through both portions 111a and 111b. Generally, it is difficult to generate a circularly polarized magnetic signal with one source. However, as discussed in more detail below, a circularly polarized magnetic signal can be generated with two sources.

By passing the probe beam 131a-131b through both portions, the effects of linearly polarized signals are suppressed from properties of the output probe beam 131b measured by probe beam sensor 141. Thus, the signal recorded by probe beam sensor measurement device 151 is substantially affected only by the circularly polarized signal 161 emitted by signal source 160.

Figure 2:
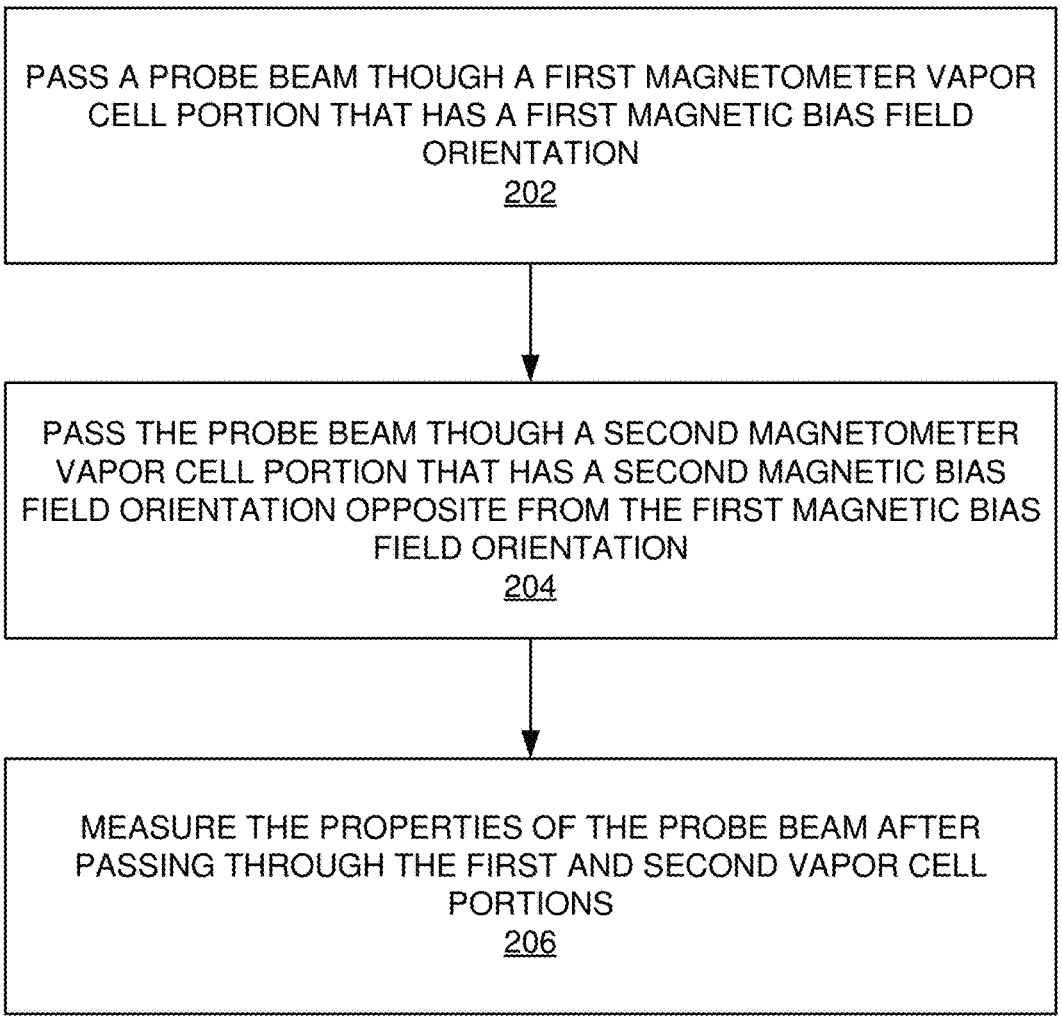
FIG. 2 is a flowchart illustrating an example of set of operations for receiving a magnetic signal in accordance with some embodiments of the present technology.

FIG. 2 is a flowchart 200 illustrating an example of a set of operations for receiving a magnetic signal in accordance with some embodiments of the present technology. The steps illustrated in FIG. 2 may be performed by one or more elements of optically-pumped magnetometer 100, and/or its components. A probe beam can be passed through a first magnetometer vapor cell portion that has a first magnetic bias field orientation (202). For example, probe beam 131a may be passed through vapor cell portion 111a-which has a bias field oriented left-to-right in FIG. 1.

The probe beam can be passed through a second magnetometer vapor cell (or cell portion) that has a second magnetic bias field orientation that is opposite from the first (204). For example, probe beam 131a may, after passing through vapor cell portion 111a, be passed through vapor cell portion 111b-which has a bias field oriented right-to-left in FIG. 1. As such, the bias fields $B_0$ have opposite orientation, and the identically circularly polarized pump beams are parallel to $B_0$.

The optical properties (e.g., direction of light polarization) of the probe beam are measured after passing through the first and second vapor cell portions (206). For example, probe beam light polarization sensor 141 and probe beam sensor measurement device 151 may be used to measure and record the direction of light polarization of the probe beam output 131b after being passed through vapor cell 111. Because this configuration reduces or eliminates the effect of linearly polarized magnetic signals (e.g., noise 171) on the output probe beam light polarization (e.g., 131b) but does not reduce or eliminate the effect of circularly polarized magnetic signals (e.g., signal 161) on the probe light polarization, the measured light polarization of the probe beam (e.g., 131b) after being passed through the first (e.g., 111a) and second (e.g., 111b) optically pumped magnetometer vapor cell portions is indicative of a circularly-polarized magnetic signal (e.g., 161) with linearly-polarized ambient noise (e.g., 171) removed.

Figure 3:
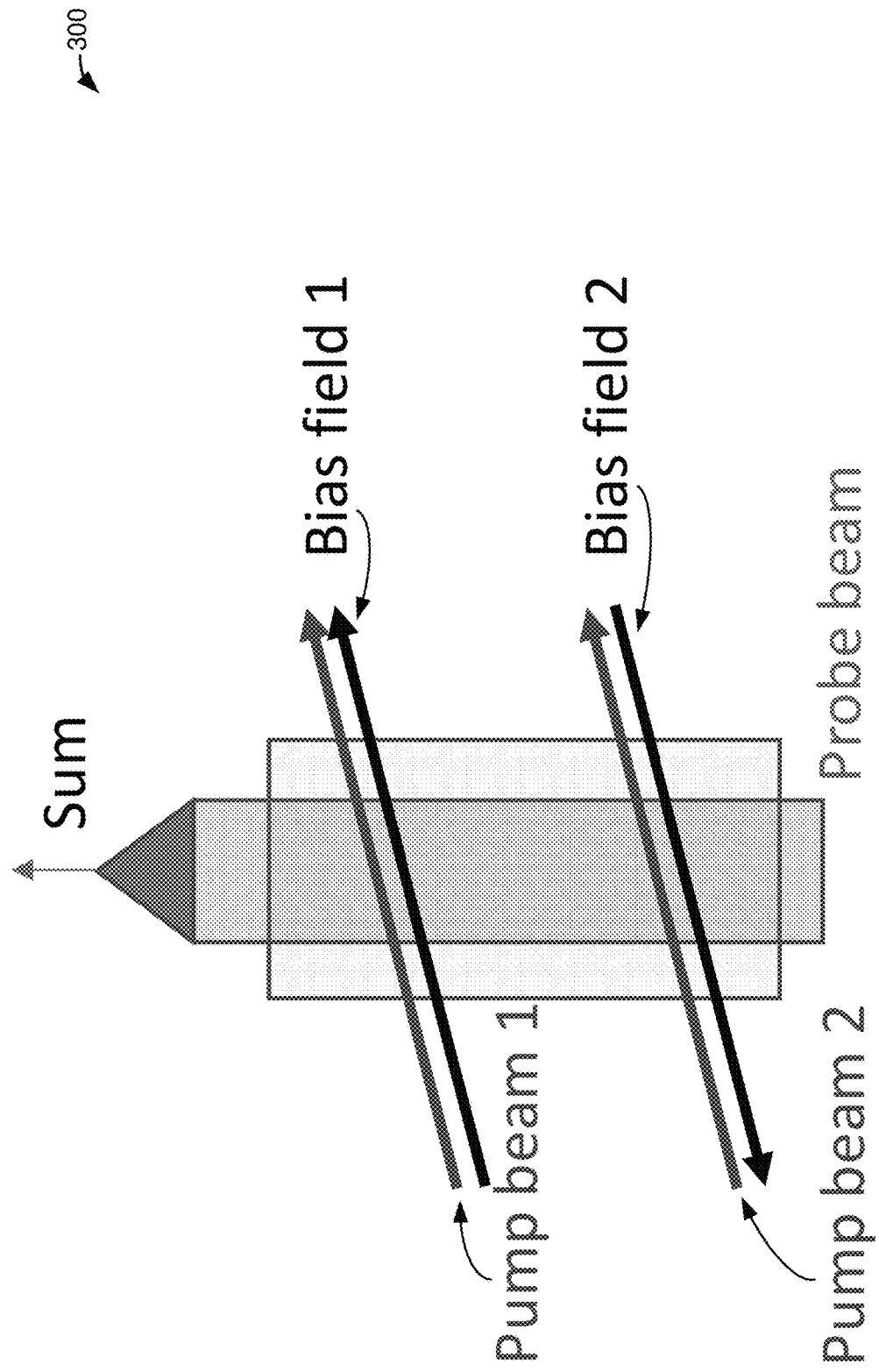
FIG. 3 is an illustration of an optically pumped magnetometer that uses a single vapor cell in accordance with some embodiments of the present technology.

FIG. 3 is an illustration of an optically pumped magnetometer 300 that uses a single vapor cell in accordance with some embodiments of the present technology. It should be understood that the same vapor cell and the same pump and probe lasers, and pump and probe beams, may be used. To use the same vapor cell and probe beam, the probe beam must propagate through both regions with opposite bias field directions—along the x-axis, while the pump beams and the bias fields 1 and 2 are along the z axis (e.g., FIG. 2). Since the magnetic field cannot abruptly change direction, there will be a bias field gradient across the cell (and a zero field region) along the x-axis. Then the use of a broad pump beam will result in broadening of the magnetometer bandwidth (the bias field, and the resonance frequency, will change across the cell). One may also use two sections of a single broad pump beam to create the two necessary optically pumped cell regions.

It should be understood that the geometry of the magnetometer setup is very important. The magnetometer is sensitive to the vector component of the RF field in a plane orthogonal to the direction of the bias field $B_0$. The probe beam direction of propagation is this plane. The angle between the probe beam direction and the virtual line connecting transmitter and receiver determines the phase of the detected signal with respect to the phase of the transmitted RF signal. This can be used for positioning/location through triangulation.

It should also be understood that there is one possible noise suppression scheme based on the direction of the bias field. The most general scheme of noise suppression would use independent cells, bias field sources, pump and probe laser beams. The necessary probe beam output addition can be done after the beams interact with the atoms in the corresponding vapor cells (or vapor cell portions)—either optically or electronically. These configurations are further detailed in FIGS. 3-4.

For improved results and to reduce common noise sources, the same vapor cell, the same bias magnetic field source, and the same laser sources for the pump and probe beams may be used. In the case of bias magnetic field reversal, the same probe beam for both magnetometers may be used—as one needs signal addition.

In various embodiments, the effect of the magnetic signal on the light polarization of the pump beam is used. When the pump beam power is measured, the needed phase information is lost, and the noise cancellation is reduced or eliminated. The RF magnetometer is sensitive to the direction from which the magnetic signal comes—with respect to the probe beam direction. This can be used for positioning/location—for example, by signal triangulation.

Figure 4:
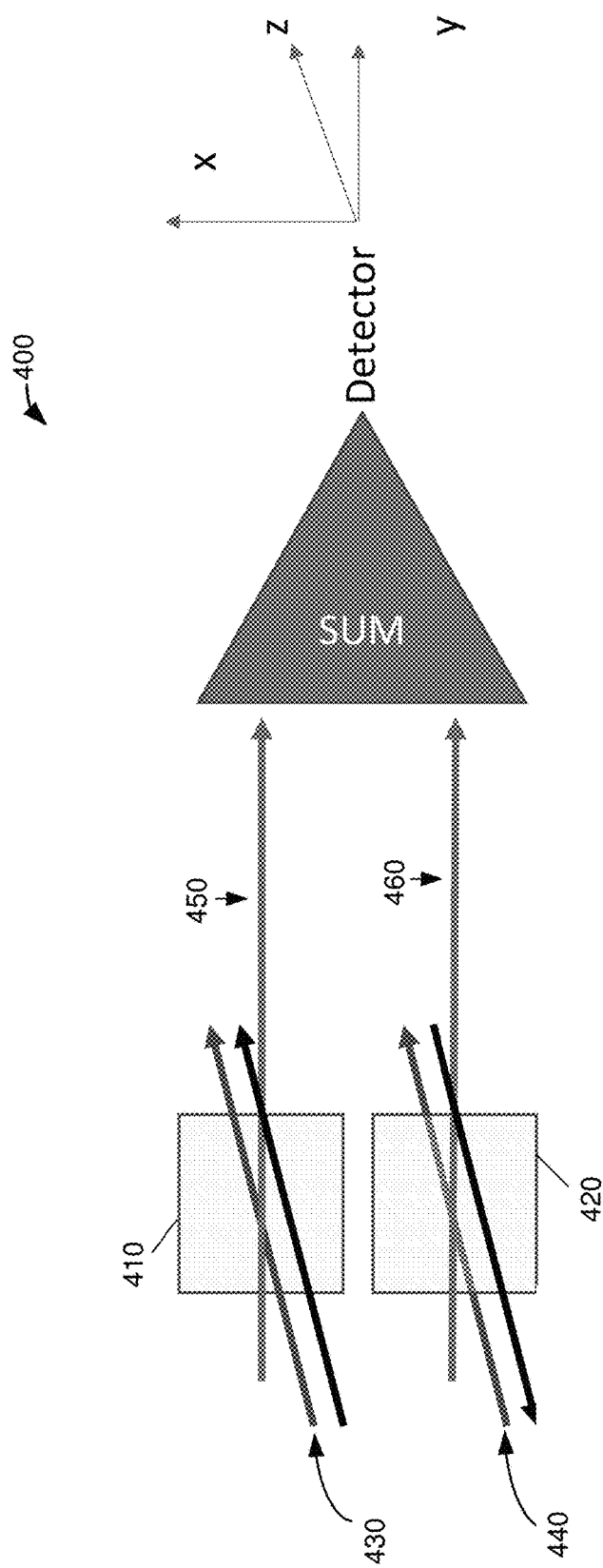
FIG. 4 is an illustration of two vapor cell optically pumped magnetometers in accordance with some embodiments of the present technology.

FIG. 4 is an illustration 400 of two vapor cell optically pumped magnetometers 410 and 420 in accordance with some embodiments of the present technology. As illustrated in the embodiments shown in FIG. 4, the first and second pump beams 430 and 440 are parallel to the bias field (z-axis). The pump beam polarizations are circularly polarized in the same direction (z-axis) and the probe beams are in the plane (xy-plane) perpendicular to the bias field. The probe beams 450 and 460 can be linearly polarized and the RF field can be in the plane perpendicular to the bias field (xy-plane).

Two-Channel RF Magnetometer

To study the sensitivity of the RF magnetometer to the polarization of the low-frequency magnetic fields, a two-channel RF magnetometer with an active volume of 27 mm$^3$ was constructed. FIG. 5A shows the optical cell assembly 500 of the RF magnetometer. The cubic (3×3×3 mm$^3$ internal volume) pyrex vapor cell 510 contains enriched $^{87}$Rb and 500 Torr nitrogen as a buffer gas. The thickness of the cell's optical-quality windows is 0.5 mm. Two λ/4 wave-plates (2×2×0.2 mm) are epoxied on the front window (in the xy-plane) of the cell. The slow axes of the waveplates are orthogonal, and at ±45° with respect to the y-axis.

A linearly-polarized 4 mm diameter pump laser beam at λ=794.99 nm (on resonance with the 6s$^2$S$_{1/2}$→6p$^2$P$_{1/2}$ pressure-shifted atomic transition) propagating along the z-axis passes through the waveplates, creating two separate sections of the cell with pump light of opposite circular polarizations. The reduced $^{87}$Rb diffusion due to the buffer gas spatially separates the atoms pumped with light of opposite circular polarization.

A linearly-polarized probe beam at λ=780.12 nm (detuned from the 6s$^2$S$_{1/2}$→6p$^2$P$_{3/2}$ pressure-shifted atomic transition) propagates through the cell along the negative x-axis. The incoming probe beam initially propagates along the z-axis and is directed in the vapor cell with an aluminum-coated 3 mm prism (see FIG. 5B). After the cell, a second identical prism sends the probe beam in the negative z-direction through a polarimeter for balanced detection. The linear polarization of the probe beam experiences optical rotation in the presence of an atomic polarization precessing in the polarization plane of the probe beam.

The optical cell assembly shown in FIG. 5B is mounted in a 50 mm long, 26 mm diameter cylindrical oven made of machinable glass-ceramic. The oven accommodates the optical cell assembly and provides optical access for the pump and probe beams. It also allows the cell to be heated to ~100° C. with a non-magnetic resistive heater driven by a current from a DC power supply. The oven is mounted in the center of a 3D printed coil assembly that is used to generate the static bias magnetic field B$_0$ parallel to the z-axis, and the two mutually orthogonal linearly-polarized RF magnetic fields B$_{RF}^x$(t) and B$_{RF}^y$(t) are created by two RF coil pairs identical to the bias field coil pair. The current used to drive the RF magnetic fields is generated by an ac voltage applied across the connected in series 200 kOhm resistor and the RF field coils. The voltage is generated by a two-channel function generator that allows precise phase control of the B$_{RF}^x$(t) and B$_{RF}^y$(t) signals.

Magnetometer Response as a Function of the Bias Magnetic Field

Figure 6:
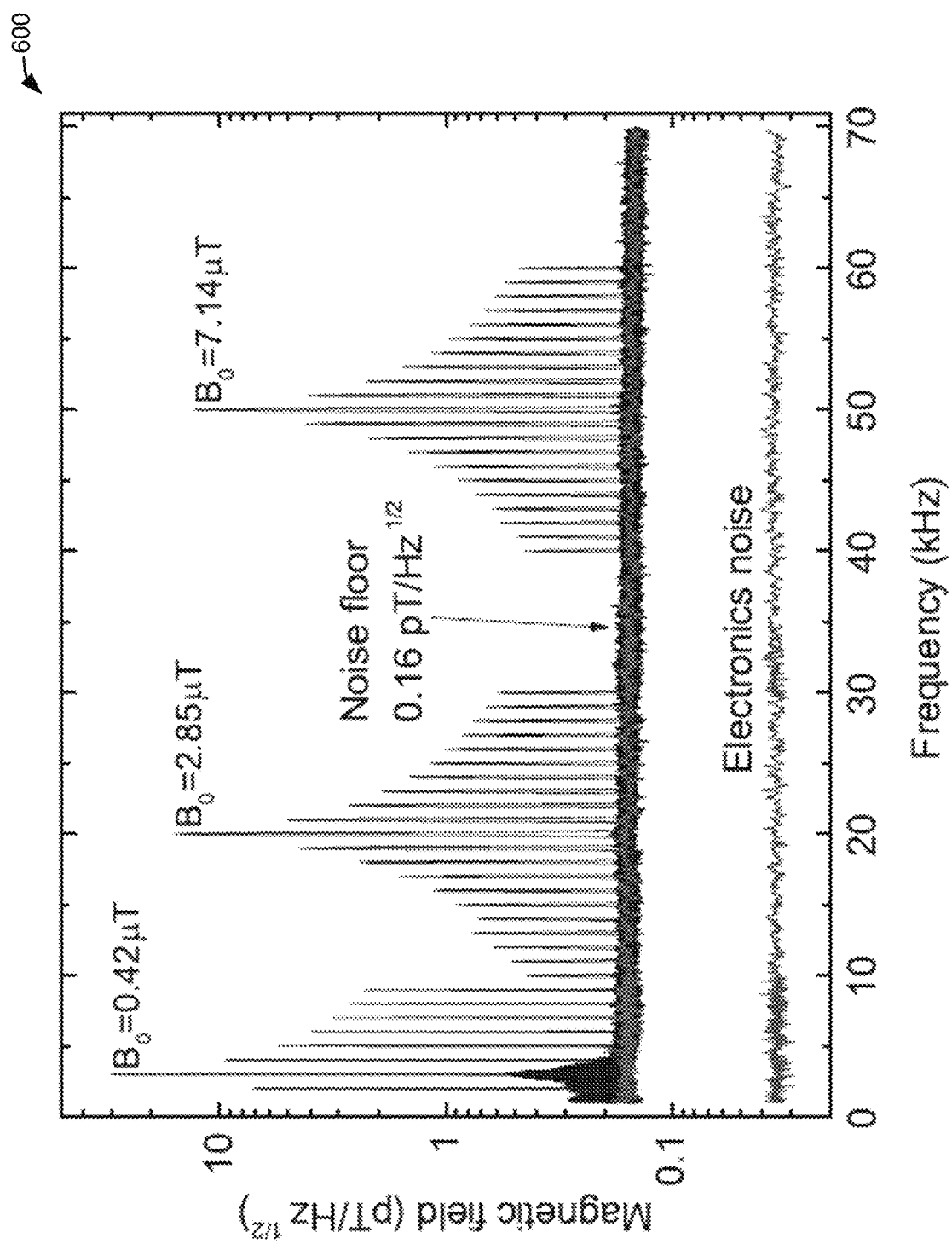
FIG. 6 is a diagram of the tuning of an RF magnetometer to a specific frequency response by changing the value of the bias field $B_0$ in accordance with some embodiments of the present technology.

In this section results demonstrating the RF magnetometer tunability and noise floor are presented. The measurements were performed before the quarter waveplates were installed, allowing the entire cell active volume of 27 mm$^3$ to be used. The magnetometer bias field B$_0$ was chosen to correspond to three discrete Larmor precession frequencies (3, 20 and 50 kHz, corresponding to B$_0$ values of 0.42, 2.85 and 7.14 μT). For each three values of the bias field B$_0$, B$_{RF}^x$(t) magnetic signal was applied at a specific frequency, and a spectrum analyzer was used to measure the response of the balanced polarimeter. The B$_{RF}^x$(t) signal frequency was changed in 1 kHz steps. The measurement results are shown in FIG. 6. The RF magnetometer has a full width at half maximum bandwidth of 1.45 kHz, and a noise floor of 160 fT/Hz$^{1/2}$, limited by the probe light noise. The polarimeter detection electronics noise (when the probe light is blocked) is below 40 fT/Hz$^{1/2}$.

Polarization State of the RF Magnetic Field Signal

The response of an RF magnetometer to a resonant RF magnetic field signal of different polarization is analyzed first. Consider the orientation of the bias field B$_0$ that determines the magnetometer's frequency response, the direction of the circular polarization of the pump laser light, and the state of polarization of the RF magnetic field (linear or circular). In this embodiment of the two-channel RF magnetometer all possible configurations that are shown in FIGS. 7A-7H can implemented.

The RF magnetometer's principle of operation can be intuitively described by considering the atomic polarization as a vector obeying the Bloch equations of motion. Let's consider a coordinate system with quantization axis along the z-axis, and use the rotating wave approximation to transform into a system rotating with the Larmor precession frequency (determined by the value and the direction of B$_0$ as well as the atomic gyromagnetic ratio) in the corresponding Larmor precession direction.

Let's assume that a σ$^+$ circularly-polarized laser beam creates an atomic polarization aligned with the z-axis, in the stretched atomic state m$_F$=F, with F the total angular momentum of the quantum system, and m$_F$ its projection along the quantization axis. A resonant rotating magnetic RF field B$_{RF}$ with a frequency equal to the Larmor precession frequency will be stationary in the coordinate system rotating in the direction of the Larmor precession, and will tilt the atomic polarization away from the quantization axis, creating an atomic polarization component in the plane orthogonal to the quantization axis (xy-plane). This atomic polarization will start precessing around the quantization axis. The same mechanism for driving the spin precession by an RF magnetic field is used in the classical optically-pumped M$_x$ magnetometer. In the presented example (see FIG. 7A), the instantaneous atomic polarization in the laboratory frame is shown in the x-direction with an arrow. In the stationary coordinate system, the atomic polarization component will precess at the Larmor frequency in the xy-plane in counter-clockwise direction. A linearly-polarized probe beam propagating in the same plane will experience a corresponding polarization rotation modulated at the Larmor frequency that can be detected with a polarimeter.

If the direction of the bias magnetic field B$_0$ is reversed (see FIG. 7B), the direction of the Larmor precession reverses. In a coordinate system rotating in the direction of the Larmor precession, the rotating RF magnetic field $\vec{B}_{RF}$ will no longer be stationary in the rotating frame, and will not cause a resonant tilt of the atomic polarization away from the quantization axis. The atomic polarization component in the xy-plane will be negligible compared to the case of oppositely-oriented bias field B$_0$, and no signal will be detected by the polarimeter. This situation can also be understood from the point of view of angular momentum conservation. The atoms are prepared in a stretched state with a maximum value of the projection quantum number m$_F$=F, and are not allowed to absorb a photon from the circularly-polarized RF magnetic field that would increase the value of m$_F$.

Figure 7A:
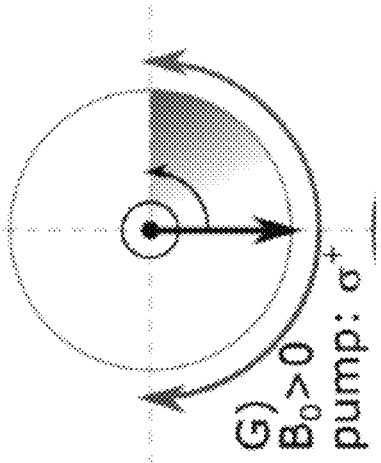
FIGS. 7A-7H illustrate various configurations for the bias magnetic field $B_0$ direction, the polarization of the RF magnetic field $B_{RF}^y$; and the pump light circular polarization in accordance with some embodiments of the present technology.
Figure 7B:
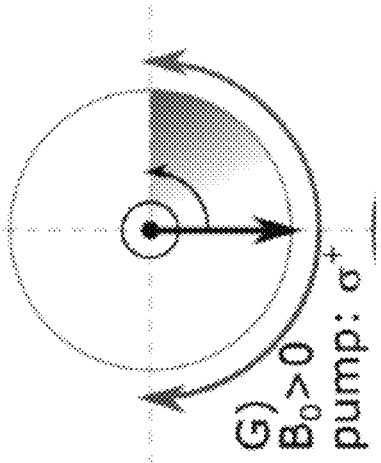
Figure 7C:
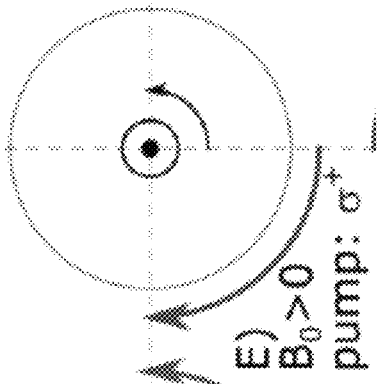
Figure 7D:
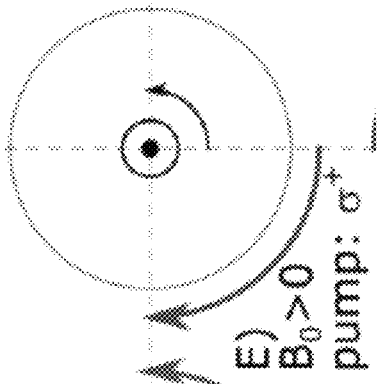

For a linearly-polarized RF magnetic field B$_{RF}$, the situation is different (see FIGS. 7C and 7D). The linear field polarization can be decomposed into two in-phase circularly polarized field components rotating in opposite directions. For both possible orientations of the bias field B$_0$, there will be an RF magnetic field component that is stationary in the coordinate system rotating in the direction of the Larmor precession, and corresponding polarimeter signals. In both cases, a photon belonging to the corresponding circularly polarized RF field would lead to an allowed decrease of the value of $m_F$, and the corresponding signals will be out of phase.

In a two-channel system, with each channel having opposite orientation of the bias magnetic field $B_0$, the sum of the polarimeter signals from the two channels will give a signal in the case of circularly-polarized RF magnetic field BRF (FIGS. 7A and 7B), and no signal for the case of linearly-polarized field $B_{RF}$ (FIGS. 7C and 7D). Such a noise suppression scheme relies on detecting a circularly-polarized RF magnetic signal, and rejecting a linearly-polarized noise.

Figure 7E:
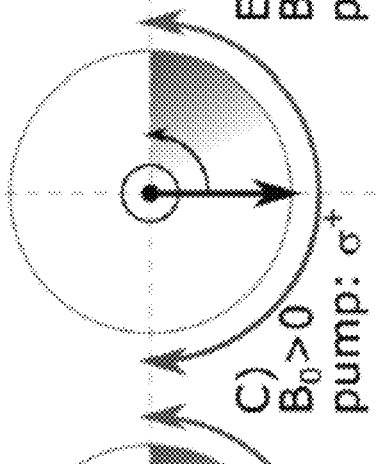
Figure 7F:
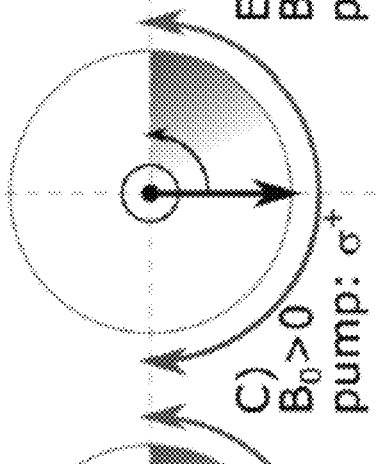
Figure 7G:
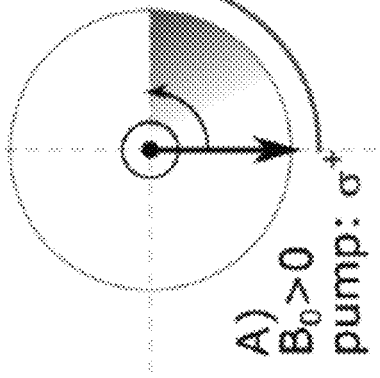
Figure 7H:
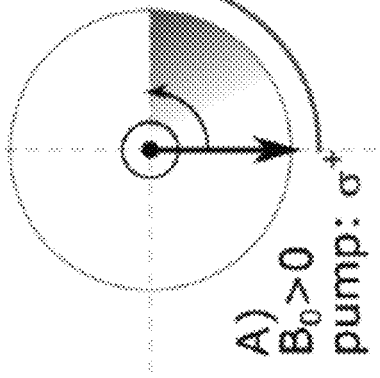

Another possibility offered by the RF magnetometer is to use the direction of the circular polarization of the pump light, keeping the direction of the bias field $B_0$ the same. If the rotation direction of a circularly-polarized RF magnetic field does not coincide with that of the Larmor precession, there is no polarimeter signal for either pump circular polarization orientation (FIGS. 7E and 7F). If the RF magnetic field is linearly polarized, the field component rotating in the direction of the Larmor precession is going to tilt the atomic polarization away from the z-axis.

The atomic polarization in the xy-plane will either be in the direction of the x-axis for $\sigma^+$ circularly-polarized pump light (FIG. 7G) or in the opposite direction for $\sigma^-$ circularly-polarized pump light (FIG. 7H) at a given instant. In such situation the difference between two channels results in either no signal (FIGS. 7E and 7F), or in twice the noise (FIGS. 7G and 7H) because there is a π rad phase difference for the atomic polarizations driven by a linearly-polarized noise and for $\sigma^+$ and $\sigma^-$ circularly-polarized pump beams. This channel configuration thus leads to a measurement of only the linearly-polarized noise, rejecting the circularly-polarized RF magnetic field signal. The measured noise could then be subtracted from the output of an independent channel that measures both signal and noise.

It should be mentioned that using an RF field with the opposite circular polarization to that of the cases shown in FIG. 7E and FIG. 7F would result in atomic polarizations rotating out of phase with each other but in the same direction, as the bias field and Larmor precession directions are the same for both cases FIG. 7E and FIG. 7F. This is essentially the same situation encountered in the cases FIG. 7G and FIG. 7H. Using the difference between two such channels would result in twice the signal, but also in twice the contribution of the linearly-polarized noise.

Sensitivity to the Polarization and Direction of the RF Magnetic Field-Density Matrix Approach A simple theoretical model can be developed to capture qualitatively the concepts above and illustrated in FIGS. 7A-7G. The model considers the ground state manifold of the $^{87}$Rb atom, with the energy of the Zeeman states of the F=2 ground state hyperfine component determined by the Breit-Rabi formula. The energy splitting between the Zeeman states is determined by the value of the static magnetic field $B_0$ chosen parallel to the quantization z-axis. The atomic system is described by a 5×5 density matrix, as all microwave transitions connecting the F=1 and F=2 components of the ground state hyperfine manifold are neglected here.

The total Hamiltonian of the system includes the atomic Hamiltonian $H_0$ in the presence of a static magnetic field $B_0$, as well as an interaction Hamiltonian $H_{RF}$ in the presence of an RF magnetic field $$B_{RF}(t)=B_{RF}^x s(t)+B_{RF}^y(t)+B_{RF}^x(t)\cos(2\pi vt)+B_{RF}^y(t)\cos(2\pi vt+\varphi)$$

confined in the xy-plane. The phase delay p between the x and y-components $B_{RF}^x(t)$ and $B_{RF}^y(t)$ of the RF field controls the field's polarization stage.

The time evolution of the atomic system is calculated using the von Neumann equation:

$$i\hbar \frac{d\rho(t)}{dt} = [(H_0 + H_{RF}), \rho(t)]$$

For simplicity, the atomic system evolution describing the RF magnetometer operation is broken down to three steps.

First, the optical pumping process is taken into account by setting the proper initial conditions for the density matrix ρ(0). For optical pumping with $\sigma^+$ circularly polarized light, the diagonal matrix element of ρ(0) corresponding to the |F=2, $m_F$=2⟩ atomic state is set to 1, while all other are set to zero. This corresponds to the situation when the laser light pumps all the atoms into the stretched state $m_F$=F. For the opposite circular polarization $\sigma^-$ of the optical pumping light, only the diagonal element of the initial density matrix ρ(0) corresponding to |F=2, $m_F$=−2⟩ is set to 1, while all other are set to zero.

Second, the von Neumann equation is solved numerically. We select the following example values:

$$B_0 = 7\mu T, v = \frac{B_0(g_J - 5g_I)\mu_B}{8\pi\hbar},$$

$B_{RF}^x=B_{RF}^y=9$ nT, and the duration of the time evolution τ=100/v. The Landé factor is $g_J$=2.0023311(20) for the $^{87}$Rb ground state and the nuclear g-factor is $g_I$=0.0009951414 (10).

Third, the final state of the atomic system ρ(π) is used to calculate the atomic polarization along the x-direction:

$$P_x=Tr(\rho(T)\hat{S}_x)$$

and in the xy-plane:

$$P_{xy}=\sqrt{[Tr(\rho(\tau)\hat{S}_x)]^2+[Tr(\rho(\tau)\hat{S}_y)]^2}$$

The rotation of the detection light polarization is proportional to the component of the atomic polarization along the probe beam (x-axis). In this way, the atomic polarization can be qualitatively compared to the output of the polarimeter, and the temporal evolution of the atomic polarization can be used to simulate the effect of the RF field on the magnetometer output.

Figure 8:
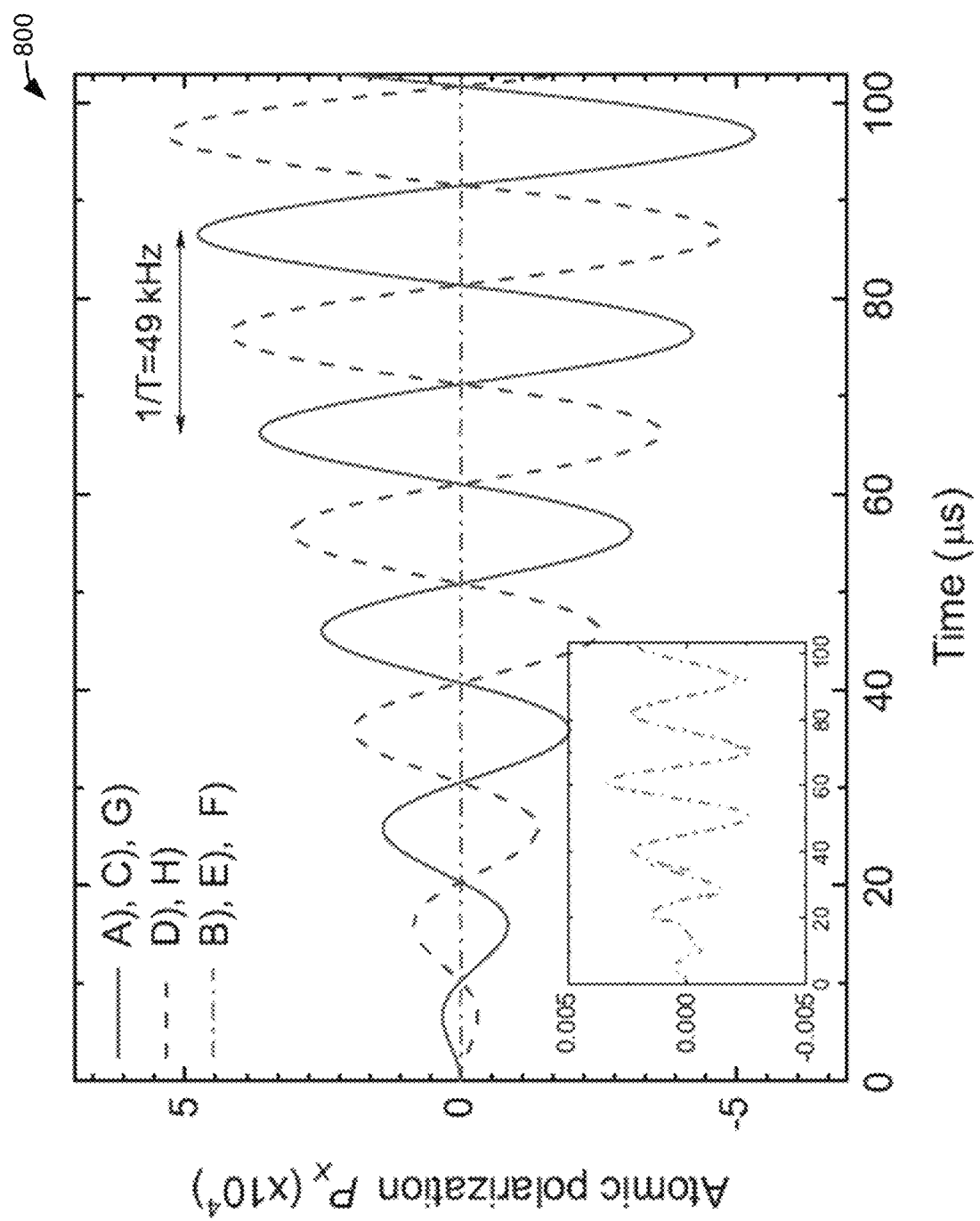
FIG. 8 is a diagram illustrating an example of the time evolution of the atomic polarization $P_x$ in accordance with some embodiments of the present technology.

FIG. 8 shows pot 110 of the amplitude of the atomic polarization $P_x$ in the x-direction as a function of time. The value of $P_x$ oscillates at the Larmor frequency of 49 kHz determined by the bias field $B_0$=7 μT. The RF magnetic field is chosen to have a constant magnitude, and a polarization state determined by the variable φ, according to the specific examples depicted on FIGS. 7A-7H. For certain orientations of the bias field $B_0$ and the polarization state of the RF field $\vec{B}_{RF}$, the atomic polarization is negligible (cases (B), (E) and (F)), as expected from arguments discussed in Section IV.

For the cases (A), (C) and (G), the polarization phase is determined by the direction of the counterclockwise direction of the Larmor precession for $B_0>0$ and $\sigma^+$ pump light polarization. The calculation predicts a suppression factor of ~1000 between cases with precessing polarization and these without, as can be seen from the insert of FIG. 8. When the direction of the bias field $B_0$ is reversed, the phase of the atomic polarization precession changes by $\pi$ rad (case (D)) due to the direction change of the Larmor precession. It also precesses out of phase when $B_0>0$, when $\sigma^+$ circular polarization is used for optical pumping (case (H)).

Figure 9:
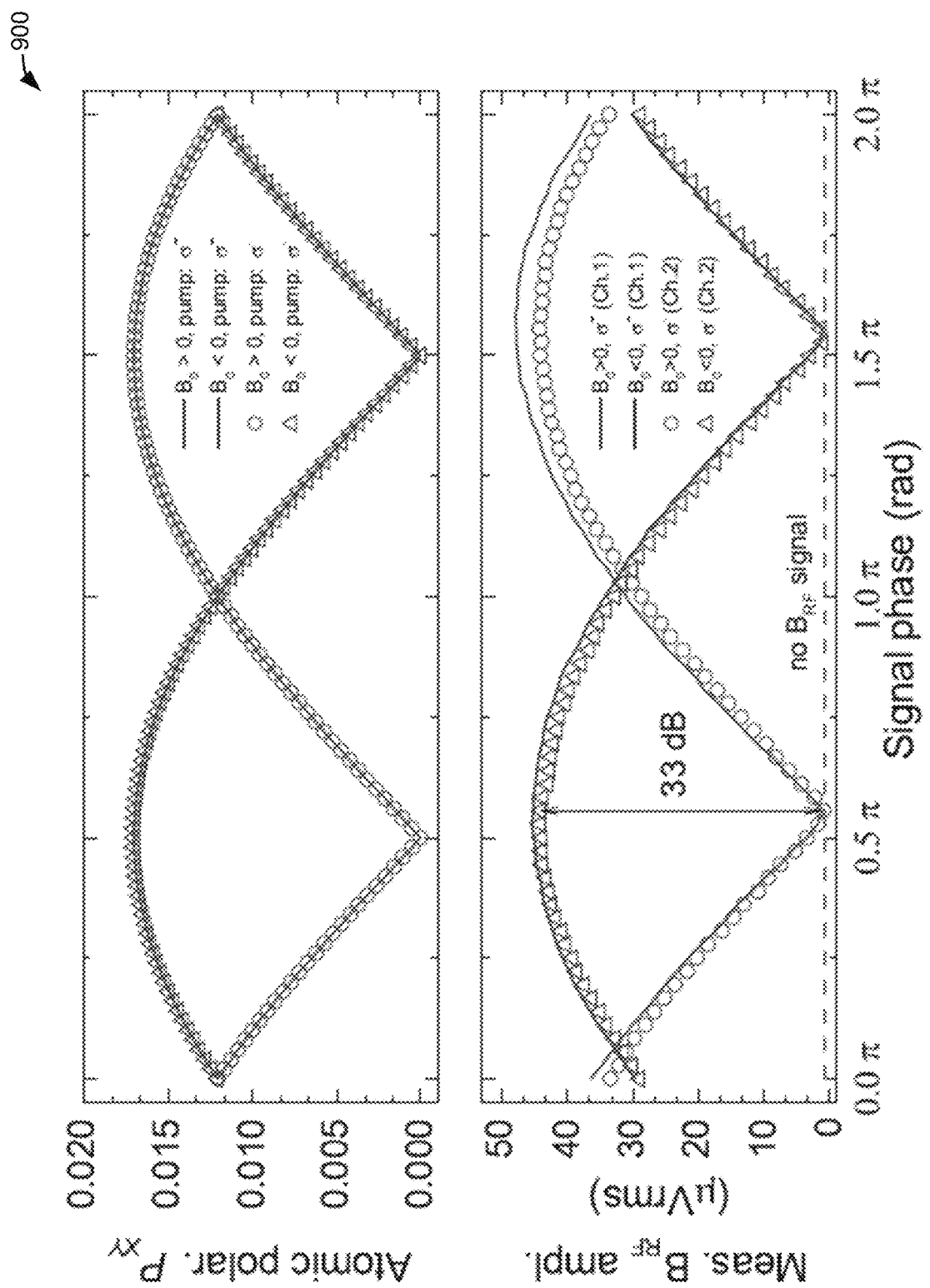
FIG. 9 is a diagram showing atomic polarization $P_{xy}$ as a function of phase $\varphi$ between $B_{RF}^x(t)$ and $B_{RF}^y(t)$ after a time evolution of $\tau=100/\nu$; and the measured polarimeter response as a function of phase p.

The dependence of the atomic polarization $P_{xy}$ in the xy-plane on the phase $\varphi$ controlling the RF magnetic field polarization is shown in FIG. 9 (top plot 1200). Results are shown for different bias field $B_0$ directions (along or against the quantization axis direction) as well as pump light polarization ($\sigma^+$ or $\sigma^-$).

FIG. 9 shows that the atomic polarization $P_{xy}$ is close to zero for certain values of the phase $\varphi$. These values are $\pi/2$ for orientation of $B_0$ in the positive direction of the z-axis, and $3\pi/2$ for $B_0$ for $B_0$ oriented along the negative direction of the z-axis. These values correspond to a circular RF magnetic field polarization rotating in opposite direction to that of the Larmor precession. The results verify the intuitive vector picture described above and shown in FIG. 7 (cases (B), (E) and (F)). The change of the pump light polarization be-tween $\sigma^+$ and $\sigma^-$ does not affect the value of the $\varphi$ for which the atomic polarization $P_{xy}$ has a minimum, as the Larmor precession does not change direction. On the other hand, changing the orientation of $B_0$ changes the direction of the Larmor precession, and correspondingly to a $\pi$ rad change of the value of 9 corresponding to the minimum value of $P_{xy}$.

Without considering the detection beam direction, the RF magnetometer has azimuthal symmetry, as the bias field $B_0$ and the optical pumping beam are parallel to the quantization axis z. The magnetometer is sensitive to RF magnetic fields that have a component in the xy-plane orthogonal to the quantization axis, and the direction of the induced atomic polarization is determined by the direction of the magnetic field vector that rotates in the direction of Larmor precession.

Figure 10:
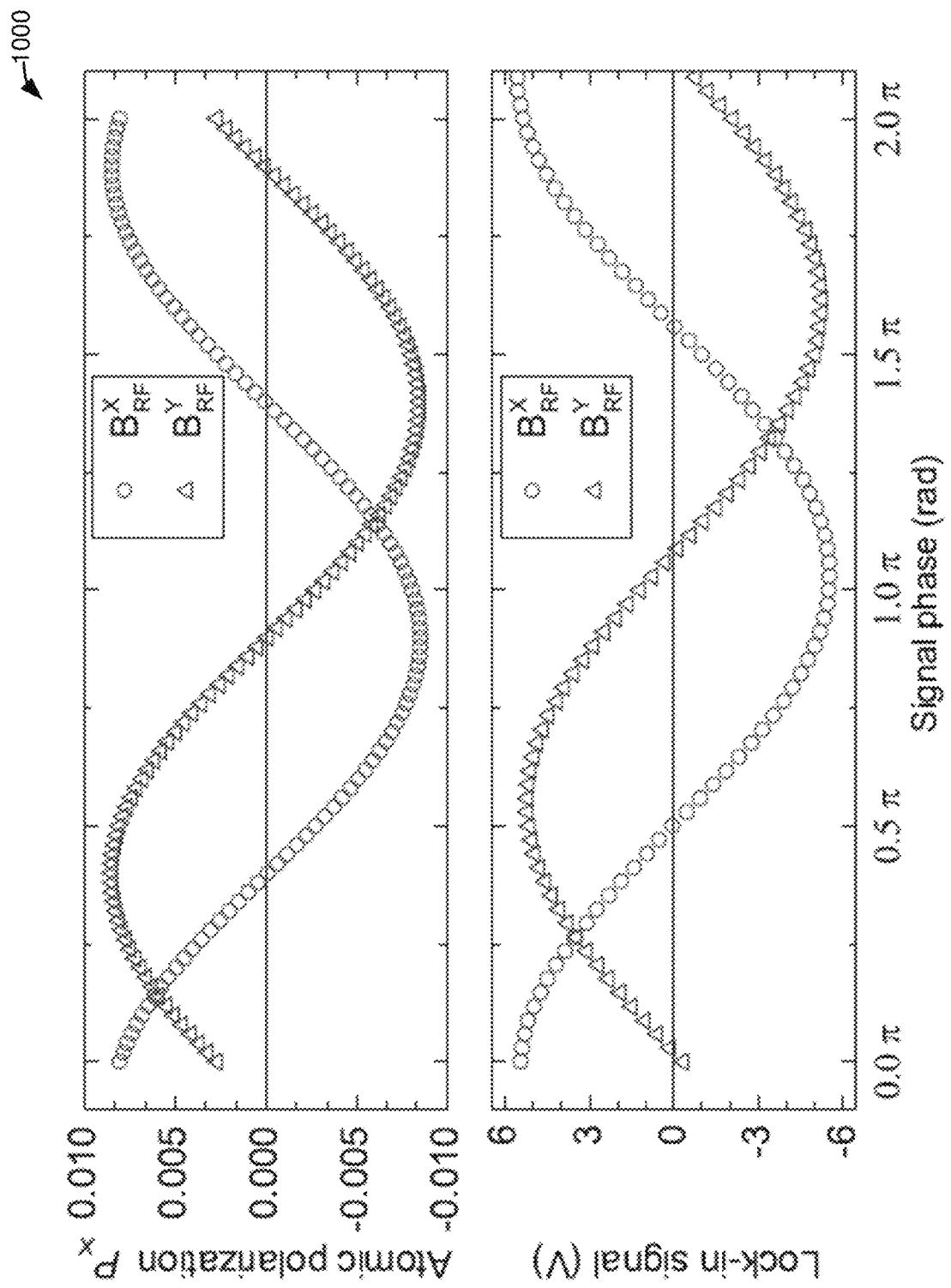
FIG. 10 is a diagram of instantaneous amplitude of the atomic polarization $P_x$ as a function of the phase of the RF field and the measured in-phase signal of the detected RF field in accordance with some embodiments of the present technology.

As the detection beam is fixed in space, its direction with respect to the precessing atomic polarization determines the phase of the detected signal. This means that the phase difference between the RF magnetic field and the detected signal depends on the orientation of the magnetic field vector and the magnetometer detection axis at any given time. This is illustrated in FIG. 10 (top plot 1000) that shows the instantaneous amplitude of the precessing atomic polarization $P_x$ along the detection axis x as a function of the phase of the linearly-polarized RF field. The RF field is applied either in the x-direction or in the y-direction. The $\pi/2$ phase difference acquired by $P_x$ when the RF field polarization is changed from the x-axis to the y-axis demonstrates the angular phase dependence of the precessing atomic polarization $P_x$.

Figure 11:
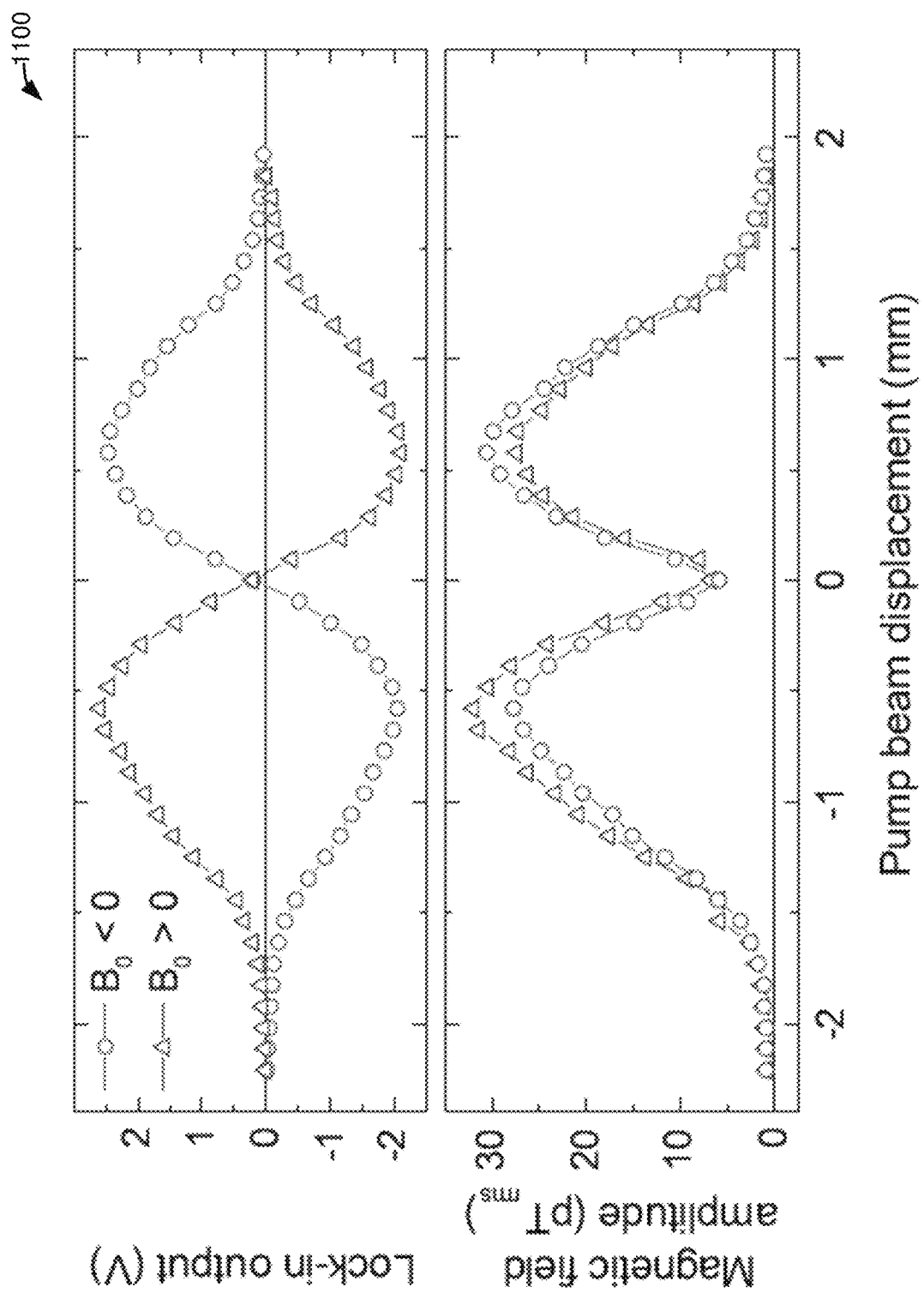
FIG. 11 is a diagram of the measured phase and amplitude of an RF magnetic signal as a function of pump beam displacement along the probe beam direction in accordance with some embodiments of the present technology.

Sensitivity to the Polarization and Direction of the RF Magnetic Field Measurement Three sets of measurements were performed according to the intuitive picture and the density matrix calculations outlined in the previous sections. The first set studied the effect of the pump light polarization on the magnetometer response. The pump laser beam was collimated to a diameter less than the width of a single magnetometer channel of 1.5 mm. Using a mirror mounted on a precision rotation mount and positioned ~60 cm away from the magnetometer, the direction of the pump beam was changed by a small angle. The angle change resulted in a calibrated spatial displacement along the direction of the probe beam, thus creating spatially-varying optical pumping as the pump beam illuminated one or the other magnetometer channels. The magnetometer was tuned to 50 kHz, and a 50 kHz signal was applied along the x-direction. The 50 kHz signal at the polarimeter output was detected with a lock-in amplifier and a spectrum analyzer, providing phase and amplitude information of the detected 50 kHz signal. The signal amplitude was converted in magnetic field values by measuring the ac voltage drop across a resistor connected in series with the field coils. The detected RF signal phase and amplitude as a function of pump beam displacement are shown in FIG. 11.

The results show that as the pump beam is scanned across each of the magnetometer channels, the maximum amplitude of the detected RF signal is similar for both channels, regardless of the orientation of the bias field $B_0$. At the same time, each channel detects opposite signal phase, as expected from the cases (G) and (H) (see FIG. 7 as well as FIG. 8). The detected signal amplitude corresponds to the amplitude of the precessing atomic polarization $P_{xy}$ in the magnetometer's xy-plane, while the phase is related to the atomic polarization $P_x$ along the magnetometer's probe beam direction (x-axis). The small differences in the response of the individual channels to the pump beam displacement or the magnetic field orientation is probably due to slight differences in the magnetometer channels, imperfect alignment of the direction and polarization of the bias and RF magnetic fields, as well as the direction and polarization of the pump and probe laser beams.

The measurements show that the precessing atomic polarization $P_{xy}$ has an opposite orientation for opposite circular polarizations of the pump light. This sensitivity can be used to sum the output of two magnetometer channels that would result in a measurement of a linearly polarized RF noise (or signal).

The second set of measurements studied the effect of the RF field polarization on the magnetometer response. The pump laser beam with a diameter less than the width of a single magnetometer channel of 1.5 mm, and was optically pumping either the first ($\sigma^+$) or the second ($\sigma^-$) magnetometer channel. Two RF magnetic signals $B_{RF}^x$ and $B_{RF}^y$ of the same frequency were applied simultaneously. The two 50 kHz signals were derived from a two-channel function generator. The phase $\varphi$ of the $B_{RF}^y$ signal was changed from 0 to $2\pi$ in 5° (87 mrad) steps. A spectrum analyzer connected to the polarimeter output was used to measure the amplitude of the polarimeter response at 50 kHz that is proportional to the magnitude of the precessing atomic polarization $P_{xy}$ in the xy-plane. The measurements are shown in FIG. 11 (bottom plot). They show a minimum amplitude of the detected RF signal for values of $\varphi$ in the vicinity of $\pi/2$ and $3\pi/2$. The ratio of the maximum to minimum values close to $\varphi=\pi/2$ is 44, corresponding to 33 dB rejection of the corresponding circular RF field polarization. The minimum value is comparable to the measurement noise floor (without an applied RF signal), and it is expected that the rejection is even higher.

The rotation of the probe beam polarization is proportional to the atomic polarization along the direction of the probe beam. The results demonstrate that for certain values of the phase $\varphi$ corresponding to circularly-polarized RF magnetic field, the RF magnetometer has a minimum or a maximum sensitivity to the RF field depending on the direction of the bias field $B_0$. This sensitivity to the polarization of the RF field can be explored to reject RF magnetic noise or signals of linear polarization while keeping the circularly-polarized RF signal unaffected by forming the difference between two magnetometer channels with opposite direction of the bias field $B_0$.

Figure 12:
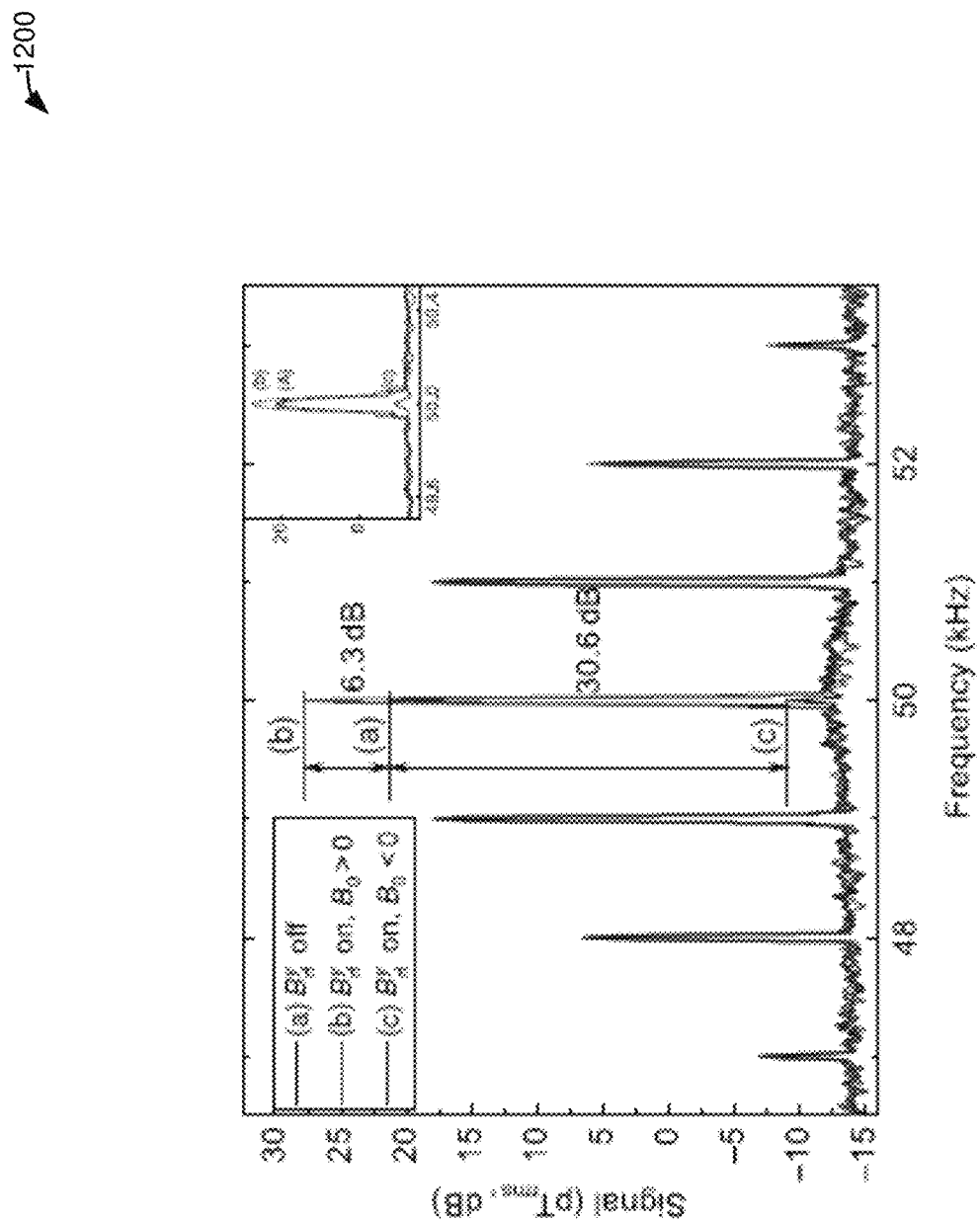
FIG. 12 is a diagram illustrating the measure signal amplitude as a function of the signal frequency for multiple cases that may be present in various embodiments of the present technology.

The measured difference in the sensor's response to a linearly and circularly polarized rf magnetic field is demonstrated in FIG. 12. As a signal $B_{RF}^x$, a phase-modulated (PM) tone at 50 kHz, with a 1 kHz modulation frequency and a deviation of $\pi/2$ rad was used. As a reference $B_{RF}^y$, a single tone at 50 kHz was used. With the reference signal turned off, the curve (a) shows the typical spectrum consisting of a carrier at 50 kHz and sidebands separated by 1 kHz, with the amplitude dependent on the modulation index and the magnetometer's 1.5 kHz frequency bandwidth.

When the reference signal $B_{RF}^y$ is turned on, for a certain signal amplitude and its phase with respect to $B_{RF}^x$, the amplitude of the 50 kHz carrier is increased by approximately 6 dB, as shown by the curve (b)—the 50 kHz carrier becomes circularly polarized and its polarization rotates in the same direction as the Larmor precession. When the direction of the bias magnetic field $B_0$ is reversed, the 50 kHz signal has the opposite circular polarization and is suppressed by >30 dB, as shown by the curve (c)—the signal is again circularly polarized but rotates in the opposite direction. The PM sidebands remain linearly polarized in all three cases and are largely unaffected by the bias-field direction switching. The measured difference in the detected signal amplitudes for opposite circularly polarized rf signals is >36 dB, showing that linearly polarized noise can be suppressed by >30 dB.

The results from the third set of measurements demonstrate the azimuthal sensitivity of the RF magnetometer. A linearly-polarized RF signal at 50 kHz from the function generator was applied either in the x-direction or in the y-direction only. The amplitude of the detected signal at the polarimeter output was measured as a function of the phase of the applied signal using a lock-in amplifier referenced by the function generator. The result is shown in FIG. 10 (bottom plot). The sinusoidal dependence of the signal amplitude shows the linear relationship between the phases of the applied and detected signals. The $\pi/2$ phase difference in the detected signal for RF field applied along the x-direction or y-direction shows the sensitivity of the RF magnetometer to the detection axis orientation with respect to the polarization direction of the RF field signal.

Discussion

Based on the results above, various embodiments of the balanced scheme can be used to construct a low-frequency magnetic field sensor designed to detect circularly-polarized signals while suppressing linearly-polarized ambient noise. The tunability of the RF magnetometer with the value of the bias magnetic field $B_0$ can be used to create a sensor operating at a specific frequency in the range of ~1 kHz up to 1 MHz and a bandwidth in the range of 1 kHz. The sensor can be used to detect circularly-polarized magnetic fields and reject linearly-polarized ambient noise by the use of a channel pair having opposite direction of the bias field $B_0$ (realized using anti-Helmholtz coils and the same current source). The necessary difference or sum of the channel pair outputs can be done electronically, but also optically. The sign reversal can be accomplished by an additional $\pi/2$ rotation of a channel's probe light polarization, after the light-atom interaction but before the light enters the channel's polarimeter using a half-waveplate. In the case of bias field reversal, the necessary sum of the channel pair outputs can be done optically by allowing the probe light to propagate consecutively through two spatial vapor cell regions with opposite directions of $B_0$.

The discussed RF magnetometer features depend on the polarization state of the RF signals. In practice, the detected RF signals are typically not circularly-polarized. One solution would be to use multiple transmitters to create such signals, which might not be practical. The requirement for circular signal polarization limits the application of the noise suppression techniques discussed in this work to the case of artificially created signals, such as ones used in magnetic field communications. It might be possible to apply the technique to free induction de-cay signals of specific frequency excited by an electromagnetic pulse (such as ultra-low field NMR and Nuclear Quadrupole Resonance). Another possible application is in magnetic induction imaging, where the presence of conductive objects changes the phase of the detected magnetic signal. Finally, as the optically-pumped medium absorbs only one of the two possible circularly-polarized RF field components, one can use this feature to construct an atomic antenna circularly polarized antenna.

The polarization properties of an effective RF signal can be changed by combining a linearly-polarized remote signal with a local reference RF signal of the same frequency and with a specific amplitude and phase relation between remote and reference signals. For example, the signal $B_{RF}^x(t)$ used in this work can this work can be treated as coming from a remote source, and the signal $B_{FR}^y(t)$ as reference. If the frequency of the remote signal $B_{RF}^x(t)$ is known, by adjusting the amplitude and phase of the reference signal $B_{RF}^y(t)$ one can achieve the desired maximum sensitivity difference shown in FIG. 9. The experimentally demonstrated amplitude rejection factor of 44 (33 dB) of the circularly-polarized RF signal rotating against the direction of Larmor precession would allow a factor of 20 ambient noise suppression, considering the need for two channels. For communications, an order of magnitude lower noise would either reduce the transmitted RF signal power by a factor of 100 or increase the communications range by a factor of 2 (for magnetic-dipole type signal attenuation with range) or decrease the averaging time by a factor of 100.

The demonstrated azimuthal dependence of the detected signal phase can be used to gain information about the magnetometer's orientation with respect to the source of an RF signal. As it has been demonstrated already, the signal phase acquired with an atomic magnetometer could reach 10 mrad level with averaging. It is expected that similar level of precision could be achieved with regard to the azimuthal angle using an RF magnetometer.

Additional Receiver Designs

Various embodiments of the present technology relate to a very-low-frequency (VLF, 3 kHz-30 kHz, extendable to 100 kHz) magnetic field-based quantum receiver for the part of the electromagnetic spectrum. The receiver system can include (1) optically-pumped multiplexed RF magnetometer channels capable of signal detection in the VLF band, (2) noise cancellation scheme to suppress the noisy background and (3) a communication protocol. In accordance with various embodiments, the multichannel system will reach noise floors below Earth's background field, and more than 1 kHz bandwidth channels covering the VLF spectrum band. The ambient background noise suppression techniques used in some embodiments can be based on reference channels that relies on a priori knowledge of the frequency of phase-modulated signals.

Potential impacts of various embodiments of the present technology include short-range communications immune to jamming, and communications through absorbing media such as seawater, rock, sediment, collapsed infrastructure and other GPS-denied environments. Some embodiments of the receiver can offer specifically: room-temperature operation, small form factor and low power, multiplexed frequency channels, offering increased channel capacity compared to a single-channel system, 500 fT/Hz$^{1/2}$ channel noise floor, reachable only with limited-bandwidth/large-size resonant structures, or cryogenic systems, possibility of a single-channel full-bandwidth sensor (at the expense of loss of sensitivity), and a novel scheme for ambient background noise suppression, azimuthal orientation sensitivity.

Various embodiments of the receiver can incorporate multiplexed channels and may be based on atomic sensor technology. Systematic differences between the channels are avoided by using: a common-source bias field, same light sources for atom preparation and signal detection, single atomic vapor cell, and a single optical polarimeter for detection. For example, in some embodiments a 10-channel receiver with noise floor <1 pT/Hz$^{1/2}$, centered at 15 kHz with 2 kHz bandwidth can be provided. Active volume: ~10 cm$^3$, physics package 15×15×15 cm$^3$ (coils size), ambient noise suppression at 15 kHz, Noise floor of a receiver for the entire VLF band (3 kHz-30 kHz), and unshielded operation of a single-channel receiver at 15 kHz with 500 fT/Hz$^{1/2}$.

Magnetic field sensors have been shown to have a superior response to electric field ones at low frequency. The current technologies for measuring magnetic signals include fluxgate magnetometers, total field magnetometers, induction coils, Superconducting Quantum Inference Devices (SQUIDs), and optically pumped total field magnetometers. Each technology has limitations given in Table 1.

channels with resonant frequencies determined by the bias magnetic field magnitude at the pairs position. In a different implementation, the probe beam can propagate along the z axis, in the line of FIG. 4. The physics package is based on a single alkali atom vapor cell containing buffer gas. The principle of RF atomic magnetometer will be used to convert the magnetic signals into electric ones. The size of the physics package is dictated by the need of ambient field compensation coils and is expected to be less than 15×15×15 cm$^3$.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "couples," or any variant thereof means any connection or coupling, either direct or indirect, between two or more elements; the coupling or connection between the elements can be physical, logical or a combination thereof. Additionally, the words "herein," "above," "below," and words of similar import, when used in this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

TABLE 1

| SENSOR | FLUXGATE | TOTAL FIELD MAGNETOMETER | INDUCTION COIL | SQUID | VLF RECEIVER |
|---|---|---|---|---|---|
| FIELD SENSITIVITY | x | x | √ | √ | √ |
| SIZE | √ | √ | x | x | √ |
| POWER | √ | x | √ | x | √ |
| CRYOGENIC FREE | √ | √ | √ | x | √ |
| POLARIZATION SENSITIVITY | x | x | x | x | √ |
| ORIENTATION SENSITIVITY | x | x | x | x | √ |

Figure 13:
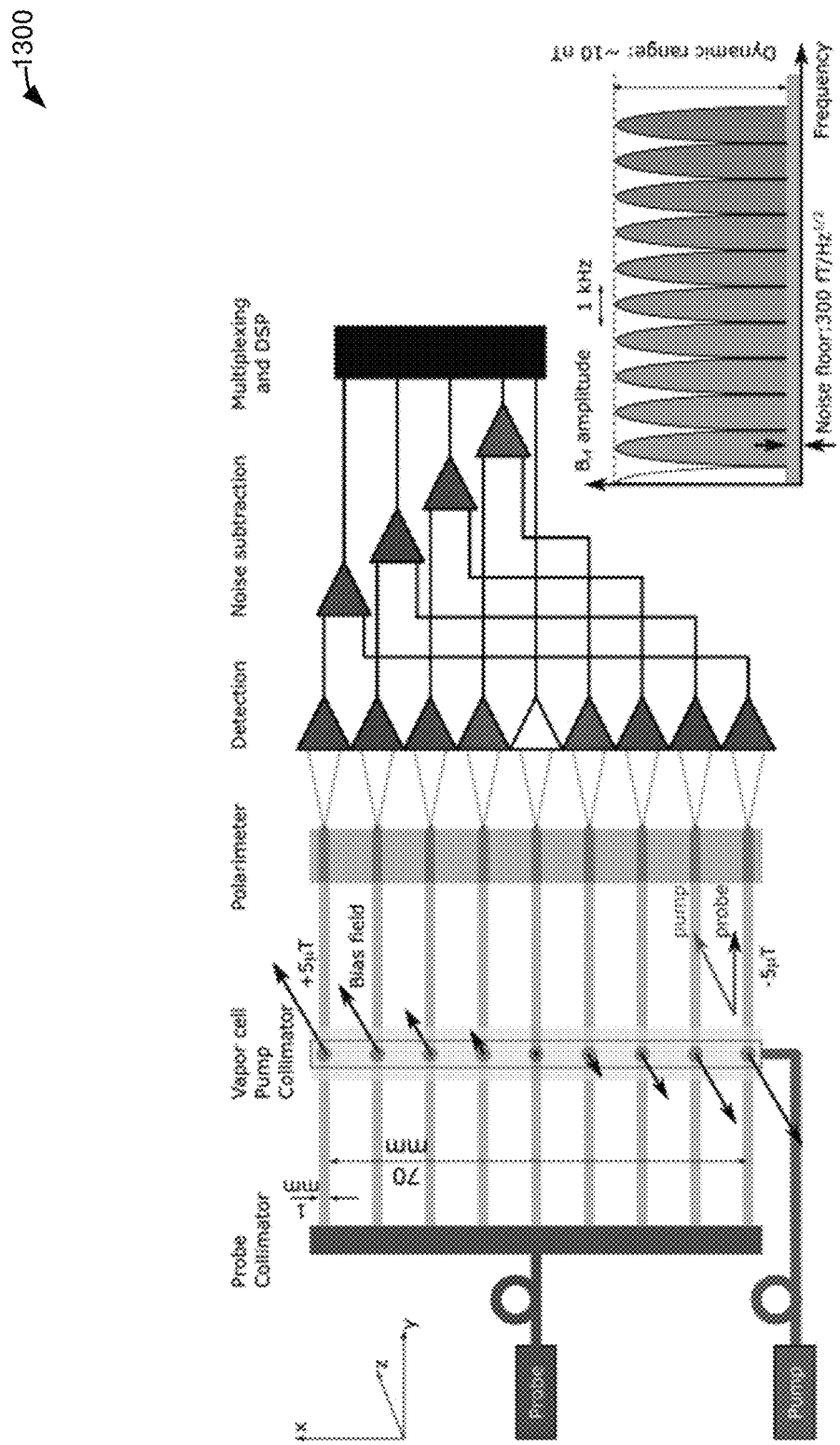
FIG. 13 is an illustration of a VLF multichannel receiver that may be used in some embodiments of the present technology.

Various embodiments of the VLF magnetic field receiver can be based on the principle of the optically-pumped RF magnetometer. The multichannel implementation of the receiver is depicted in FIG. 13. In the embodiments illustrated in FIG. 13, the multichannel implementation can use two lasers (pump and probe) with requirements met by commercially available laser diodes. A bias magnetic field is applied parallel to the z-axis. The bias field magnitude changes along the x-axis and is the same but points in opposite directions (along the z-axis or against the z-axis) for opposite parts of the cell with respect to the cell center, creating channel pairs with atoms precessing at different frequencies. An array of pump beams separate along the x-axis propagate along the z-axis, parallel to the bias magnetic field. An array of probe beams separate along the x-axis propagate along the x-axis, orthogonal to the bias magnetic field and pump beams, and form probe beam pairs propagating through cell regions with a given bias magnetic field magnitude but opposite direction. These pairs form The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The Elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as system, method, or computer-readable medium claim, other aspects may likewise be embodied in other forms, such as being embodied in a means-plus-function claim. Any claims intended to be treated under 35 U.S.C. § 112(f) will begin with the words "means for," but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A multichannel receiver comprising:
    a first channel passing a probe beam through a first optically pumped magnetometer vapor cell portion that has a first magnetic bias field orientation relative to a first circularly polarized pump beam;
    a second channel passing the probe beam through a second optically pumped magnetometer vapor cell portion that has a second magnetic bias field orientation relative to a second circularly polarized pump beam,
        wherein the first circularly polarized pump beam and the second circularly polarized pump beam are identical in intensity, frequency, polarization, and direction of propagation; and
        wherein the first magnetic bias field orientation is different from the second magnetic bias field orientation but have an equal magnitude; and
    a conversion system to convert optical properties of the probe beam affected by an incoming magnetic signal to electric signal, which adds outputs of the first channel and the second channel to suppress noise in the incoming magnetic signal.

2. The multichannel receiver of claim 1, wherein the conversion system optically sums an output of the first channel before a light to electric signal conversion takes place.

3. The multichannel receiver of claim 1, wherein the first optically pumped magnetometer vapor cell portion and the second optically pumped magnetometer vapor cell portion are portions of the same optically pumped magnetometer vapor cell.

4. The multichannel receiver of claim 1, wherein the first optically pumped magnetometer vapor cell portion and the second optically pumped magnetometer vapor cell portion are portions of different optically pumped magnetometer vapor cells.

5. The multichannel receiver of claim 1, wherein the first magnetic bias field, the second magnetic bias field, the first circularly polarized pump beam, and the second circularly polarized pump beam are all parallel.

6. The multichannel receiver of claim 1, wherein the first optically pumped magnetometer vapor cell portion and the second optically pumped magnetometer vapor cell portion are inline and a circularly polarized signal passes through the first optically pumped magnetometer vapor cell portion and then the second optically pumped magnetometer vapor cell portion.

7. The multichannel receiver of claim 1, wherein the first channel and the second channel share a single probe beam and wherein the first circularly polarized pump beam and the second circularly polarized pump beam are the same circularly polarized pump beam.

8. The multichannel receiver of claim 1, wherein the first channel and the second channel share an absorber container.

9. The multichannel receiver of claim 8, wherein the first channel and the second channel each have different probe beams.

10. The multichannel receiver of claim 8, wherein the first channel and the second channel share a single probe beam.

11. The multichannel receiver of claim 1, wherein the incoming magnetic signal includes a circularly polarized component and the second channel is insensitive to the incoming magnetic signal and measures linearly polarized noise within the incoming magnetic signal.

12. A method of receiving a magnetic signal, comprising:
    passing a probe beam through a first optically pumped magnetometer vapor cell portion that has a first magnetic bias field orientation relative to a first circularly polarized pump beam;
    passing the probe beam through a second optically pumped magnetometer vapor cell portion that has a second magnetic bias field orientation relative to a second pump beam,
        wherein the first circularly polarized pump beam and the second pump beam are identical in intensity, frequency, polarization, and direction of propagation;
        wherein the first magnetic bias field orientation is opposite to that of the second magnetic bias field orientation; and
        wherein both the first magnetic bias field and the second magnetic bias field have an equal magnitude; and
    measuring a property of the probe beam after passing through the first optically pumped magnetometer vapor cell portion and the second optically pumped magnetometer vapor cell portion.

13. The method of claim 12, wherein the first optically pumped magnetometer vapor cell portion and the second optically pumped magnetometer vapor cell portion include rubidium gas.

14. The method of claim 12, wherein the first vapor cell portion and second vapor cell portion are within a single vapor cell.

15. The method of claim 12, wherein the property of the probe beam after passing through the first optically pumped magnetometer vapor cell portion and the second optically pumped magnetometer vapor cell portion is sensitive to circularly polarized radio frequency magnetic signals.

16. The method of claim 12, wherein the property of the probe beam after passing through the first optically pumped magnetometer vapor cell portion and the second optically pumped magnetometer vapor cell portion is more sensitive to circularly polarized radio frequency magnetic signals than linearly polarized radio frequency magnetic signals.

17. The method of claim 16, wherein the linearly polarized radio frequency magnetic signals are produced by ambient sources.

18. A receiver comprising:
- a first optically pumped magnetometer vapor cell that has a first magnetic bias field orientation relative to a pump beam;
    - wherein the first optically pumped magnetometer vapor cell includes a path for a signal;
    - wherein the signal is circularly polarized and includes noise; and
    - wherein the first optically pumped magnetometer vapor cell creates a first output signal that is equal to a signal plus any noise;
- a second optically pumped magnetometer vapor cell that has a second magnetic bias field orientation relative to the pump beam;
    - wherein the first optically pumped magnetometer vapor cell and the second optically pumped magnetometer vapor cell share the pump beam; and
    - wherein the first magnetic bias field orientation is different from the second magnetic bias field orientation; and
    - wherein the second optically pumped magnetometer vapor cell creates a second output signal that is equal to a negative of the noise; and
- a conversion system to convert optical properties of a probe beam affected by an incoming magnetic signal to electric signal, which adds the first output signal and the second output signal, creating a third output signal corresponding to the incoming magnetic signal.

19. The receiver of claim 18, wherein the conversion system optically sums the first output signal and the second output signal before a light to electric signal conversion takes place.

20. The receiver of claim 18, wherein first optically pumped magnetometer vapor cell and the second optically pumped magnetometer vapor cell share a probe beam.

* * * * *

UNITED STATES PATENT AND TRADEMARK OFFICE
CERTIFICATE OF CORRECTION

| | |
|---|---|
| PATENT NO. | : 11,143,721 B2 |
| APPLICATION NO. | : 16/572423 |
| DATED | : October 12, 2021 |
| INVENTOR(S) | : Vladislav Gerginov |

It is certified that error appears in the above-identified patent and that said Letters Patent is hereby corrected as shown below:

In the Specification

Column 4, Line 41, delete "p" and insert --φ--

Column 12, Line 5, equation, delete "s(t)" and insert --(t)--

Column 12, Line 45, equation, delete "(T)" and insert --(τ)--

Column 13, Line 32, delete "9" and insert --φ--

Column 16, Line 27, delete "this work can"

Signed and Sealed this
First Day of November, 2022

Katherine Kelly Vidal
*Director of the United States Patent and Trademark Office*